US010037941B2

(12) United States Patent
Noveski et al.

(10) Patent No.: US 10,037,941 B2
(45) Date of Patent: Jul. 31, 2018

(54) INTEGRATED DEVICE PACKAGE COMPRISING PHOTO SENSITIVE FILL BETWEEN A SUBSTRATE AND A DIE

(71) Applicant: QUALCOMM Incorporated, San Diego, CA (US)

(72) Inventors: Vladimir Noveski, Encinitas, CA (US); Milind Pravin Shah, San Diego, CA (US); Rajneesh Kumar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/610,876

(22) Filed: Jan. 30, 2015

(65) Prior Publication Data

US 2016/0172299 A1    Jun. 16, 2016

Related U.S. Application Data

(60) Provisional application No. 62/091,400, filed on Dec. 12, 2014.

(51) Int. Cl.
*H01L 23/528* (2006.01)
*H01L 23/31* (2006.01)
(Continued)

(52) U.S. Cl.
CPC ...... *H01L 23/5283* (2013.01); *H01L 23/3157* (2013.01); *H01L 23/49827* (2013.01);
(Continued)

(58) Field of Classification Search
CPC ........... H01L 23/5283; H01L 23/49827; H01L 23/49838; H01L 23/3157; H01L 23/5226; H01L 24/17; H01L 24/81
(Continued)

(56) References Cited

U.S. PATENT DOCUMENTS 5,662,262 A    9/1997  McMahon et al.
6,511,607 B1   1/2003  Sakaki et al.
(Continued)

FOREIGN PATENT DOCUMENTS

JP    H0419971 A    1/1992
JP    H0888248 A    4/1996
(Continued)

OTHER PUBLICATIONS

International Search Report and Written Opinion—PCT/US2015/065098—ISA/EPO—dated Mar. 11, 2016.

*Primary Examiner* — Christine Enad
(74) *Attorney, Agent, or Firm* — Loza & Loza, LLP/Qualcomm

(57) ABSTRACT

An integrated device package that includes a die, a substrate, a fill and a conductive interconnect. The die includes a pillar, where the pillar has a first pillar width. The substrate (e.g., package substrate, interposer) includes a dielectric layer and a substrate interconnect (e.g., surface interconnect, embedded interconnect). The fill is located between the die and the substrate. The conductive interconnect is located within the fill. The conductive interconnect includes a first interconnect width that is about the same or less than the first pillar width. The conductive interconnect is coupled to the pillar and the substrate interconnect. The fill is a non-conductive photo-sensitive material. The fill is a photosensitive film. The substrate interconnect includes a second interconnect width that is equal or greater than the first pillar width. The conductive interconnect includes one of at least a paste, a solder and/or an enhanced solder comprising a polymeric material.

19 Claims, 21 Drawing Sheets

(51) Int. Cl.
*H01L 23/522* (2006.01)
*H01L 23/00* (2006.01)
*H01L 23/498* (2006.01)

(52) U.S. Cl.
CPC .... *H01L 23/49838* (2013.01); *H01L 23/5226* (2013.01); *H01L 24/11* (2013.01); *H01L 24/13* (2013.01); *H01L 24/16* (2013.01); *H01L 24/17* (2013.01); *H01L 24/27* (2013.01); *H01L 24/29* (2013.01); *H01L 24/73* (2013.01); *H01L 24/81* (2013.01); *H01L 24/92* (2013.01); *H01L 24/03* (2013.01); *H01L 24/83* (2013.01); *H01L 2224/0345* (2013.01); *H01L 2224/0346* (2013.01); *H01L 2224/0347* (2013.01); *H01L 2224/0348* (2013.01); *H01L 2224/03452* (2013.01); *H01L 2224/03602* (2013.01); *H01L 2224/03914* (2013.01); *H01L 2224/05546* (2013.01); *H01L 2224/05568* (2013.01); *H01L 2224/05571* (2013.01); *H01L 2224/05647* (2013.01); *H01L 2224/1111* (2013.01); *H01L 2224/11334* (2013.01); *H01L 2224/11438* (2013.01); *H01L 2224/131* (2013.01); *H01L 2224/13007* (2013.01); *H01L 2224/13147* (2013.01); *H01L 2224/16014* (2013.01); *H01L 2224/16111* (2013.01); *H01L 2224/16227* (2013.01); *H01L 2224/16237* (2013.01); *H01L 2224/16238* (2013.01); *H01L 2224/2711* (2013.01); *H01L 2224/27438* (2013.01); *H01L 2224/29006* (2013.01); *H01L 2224/73104* (2013.01); *H01L 2224/73204* (2013.01); *H01L 2224/81101* (2013.01); *H01L 2224/81191* (2013.01); *H01L 2224/81192* (2013.01); *H01L 2224/81801* (2013.01); *H01L 2224/83191* (2013.01); *H01L 2224/83192* (2013.01); *H01L 2924/2064* (2013.01)

(58) Field of Classification Search
USPC .......................................................... 257/737
See application file for complete search history.

(56) References Cited

U.S. PATENT DOCUMENTS

| | | | |
|---|---|---|---|
| 6,953,999 B2 | 10/2005 | Strandberg et al. | |
| 7,692,287 B2 | 4/2010 | Tago | |
| 8,198,727 B1* | 6/2012 | Singh | H01L 24/13 257/737 |
| 8,283,780 B2 | 10/2012 | Lo et al. | |
| 2007/0222039 A1 | 9/2007 | Kanda et al. | |
| 2009/0200663 A1* | 8/2009 | Daubenspeck | H01L 23/49811 257/737 |
| 2009/0266480 A1 | 10/2009 | Cordes et al. | |
| 2009/0279275 A1 | 11/2009 | Ayotte et al. | |
| 2010/0108371 A1* | 5/2010 | Furutani | H01L 21/56 174/260 |
| 2010/0143656 A1* | 6/2010 | Zu | B23K 3/0638 428/172 |
| 2011/0133327 A1* | 6/2011 | Hsu | H01L 21/563 257/692 |
| 2014/0103481 A1* | 4/2014 | Ishizuka | H01L 31/02002 257/466 |
| 2014/0203429 A1 | 7/2014 | Yu et al. | |
| 2015/0243617 A1* | 8/2015 | Osenbach | H01L 24/13 257/737 |

FOREIGN PATENT DOCUMENTS

| | | |
|---|---|---|
| JP | H1012673 A | 1/1998 |
| JP | H11330160 A | 11/1999 |
| JP | 2009110991 A | 5/2009 |

* cited by examiner

INTEGRATED DEVICE PACKAGE COMPRISING PHOTO SENSITIVE FILL BETWEEN A SUBSTRATE AND A DIE

CLAIM OF PRIORITY/CLAIM OF BENEFIT

The present application claims priority to U.S. Provisional Application No. 62/091,400 titled "Integrated Device Package Comprising Photo Sensitive Fill Between a Substrate and a Die", filed Dec. 12, 2014, which is hereby expressly incorporated by reference herein.

BACKGROUND

Field

Various features relate to an integrated device package that includes a photo sensitive fill between a substrate and a die.

Background

FIG. 1 illustrates a conventional configuration of an integrated package that includes a die. Specifically, FIG. 1 illustrates an integrated device package 100 that includes a package substrate 101, a die 103, and a fill 130. The package substrate 101 includes several dielectric layers (e.g., dielectric layer 102), several interconnects (e.g., traces, vias, pads) 105, and a set of solder balls 115. The package substrate 101 may include an interconnect 111. The interconnect 111 may be a surface interconnect located on the surface of the package substrate 101 (e.g., on the surface of a dielectric layer of the package substrate). The interconnect 111 may be a trace and/or a pad.

As shown in FIG. 1, the die 103 is coupled to the package substrate 101 through a pillar 121, a solder 123, and the interconnect 111. The pillar 121 is coupled to the die 103. The pillar 121 may be a metal layer (e.g., a copper pillar). The fill 130 is located between the package substrate 101 and the die 103. The fill 130 encapsulates the pillar 121, the solder 123, and the interconnect 111. In some implementations, the fill 130 is a paste. The die 103 is coupled to the package substrate 101 by using a thermal compression flip chip (TCFC) process. The result of using a TCFC process is that it produces a laterally elongated solder 123, as shown in FIG. 1. Specifically, the elongated solder 123 has a lateral width that is greater than the width of the pillar 121 and/or the width of the interconnect 111. An elongated solder 123 is problematic in a package that includes high density, low pitch and/or low spacing interconnects because the elongated solder 123 may make physical contact with a nearby solder, pillar and/or interconnect causing a short in the package.

FIG. 2 illustrates another example of how solder may be formed between a die and a package substrate. As shown in FIG. 2, the die 103 is coupled to the package substrate 101 through the pillar 121, a solder 200, and the interconnect 111. A fill 230 is located between the package substrate 101 and the die 103. The fill 230 encapsulates the pillar 121, the solder 200, and the interconnect 111. The fill 230 is an under fill.

In FIG. 2, the die 103 is coupled to the package substrate 101 by using a mass reflow process. The result of using a mass reflow process is that it also produces a laterally elongated solder 200. Specifically, the elongated solder 200 has a lateral width that is greater than the width of the pillar 121 and/or the width of the interconnect 111. Moreover, the solder 200 couples to the side portions (e.g., side walls) of the interconnect 111. An elongated solder 200 is problematic in a package that includes high density, low pitch and/or low spacing interconnects because the elongated solder 200 may make physical contact with a nearby solder, pillar and/or interconnect causing a short in the package.

FIG. 3 illustrates yet another example of how solder may be formed between a die and a package substrate. Specifically, FIG. 3 illustrates a die 103 coupled to a package substrate 301 through a pillar 321, a solder 323, and an interconnect 311. A fill 330 is located between the package substrate 301 and the die 303. The fill 330 encapsulates the pillar 321, the solder 323, and the interconnect 311.

The pillar 321 has a width that is less than the width of the interconnect 311. The resulting solder 323 between the pillar 321 and the interconnect 311 is the solder 323 having a width that is greater than the width of the pillar 321. This results in unnecessary material (e.g., too much solder 323), resulting in higher cost of the integrated package. Moreover, at least a majority of the solder 323 has a dimension that is greater than the pillar 321.

Therefore, there is a need for an integrated device package that provides a design that is less likely to produce solder that will causes shorts, resulting in less defective integrated device packages. Ideally, such an integrated device package will have a better design and form factor, lower cost, while at the same time meeting the needs and/or requirements of mobile, wearable or portable computing devices.

SUMMARY

Various features, apparatus and methods described herein an integrated device package that includes a photo sensitive fill between a substrate and a die.

A first example provides that an integrated device package that includes a die, a substrate, a fill located between the die and the substrate, and a conductive interconnect located within the fill. The die includes a die interconnect, where the die interconnect comprises a first die interconnect width. The substrate includes a dielectric layer and a substrate interconnect. The conductive interconnect includes a first interconnect width that is about the same or less than the first die interconnect width, where the conductive interconnect is coupled to the die interconnect and the substrate interconnect.

A second example provides a method for fabricating an integrated device package. The method provides a die that includes a die interconnect. The die interconnect includes a first die interconnect width. The method couples a non-conductive layer and a conductive interconnect to the die and the die interconnect, where coupling the non-conductive layer and the conductive interconnect includes coupling the conductive interconnect to the die interconnect. The conductive interconnect includes a first interconnect width that is about the same or less than the first die interconnect width. The method couples the die and the non-conductive layer to a substrate that includes a dielectric layer and a substrate interconnect, where coupling the die and the non-conductive layer to the substrate includes coupling the conductive interconnect to the substrate interconnect.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain to an integrated device package that includes a die, a substrate, a fill and a conductive interconnect. The die includes a pillar (e.g., die interconnect), where the pillar has a first pillar width. The substrate (e.g., package substrate, interposer) includes a dielectric layer and a substrate interconnect (e.g., surface interconnect, embedded interconnect). The fill is located between the die and the substrate. The conductive interconnect is located within the fill. The conductive interconnect includes a first interconnect width that is about the same or less than the first pillar width. The conductive interconnect is coupled to the pillar and the substrate interconnect. In some implementations, the fill is a non-conductive photosensitive material. In some implementations, the fill is a photosensitive film. The substrate interconnect includes a second interconnect width that is equal or greater than the first pillar width. The substrate interconnect includes a second interconnect width that is equal or greater than the first interconnect width. In some implementations, the conductive interconnect includes one of at least a paste, a solder and/or an enhanced solder comprising a polymeric material.

In some implementation, an interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

Exemplary Integrated Device Package Comprising Photosensitive Fill

Figure 4:
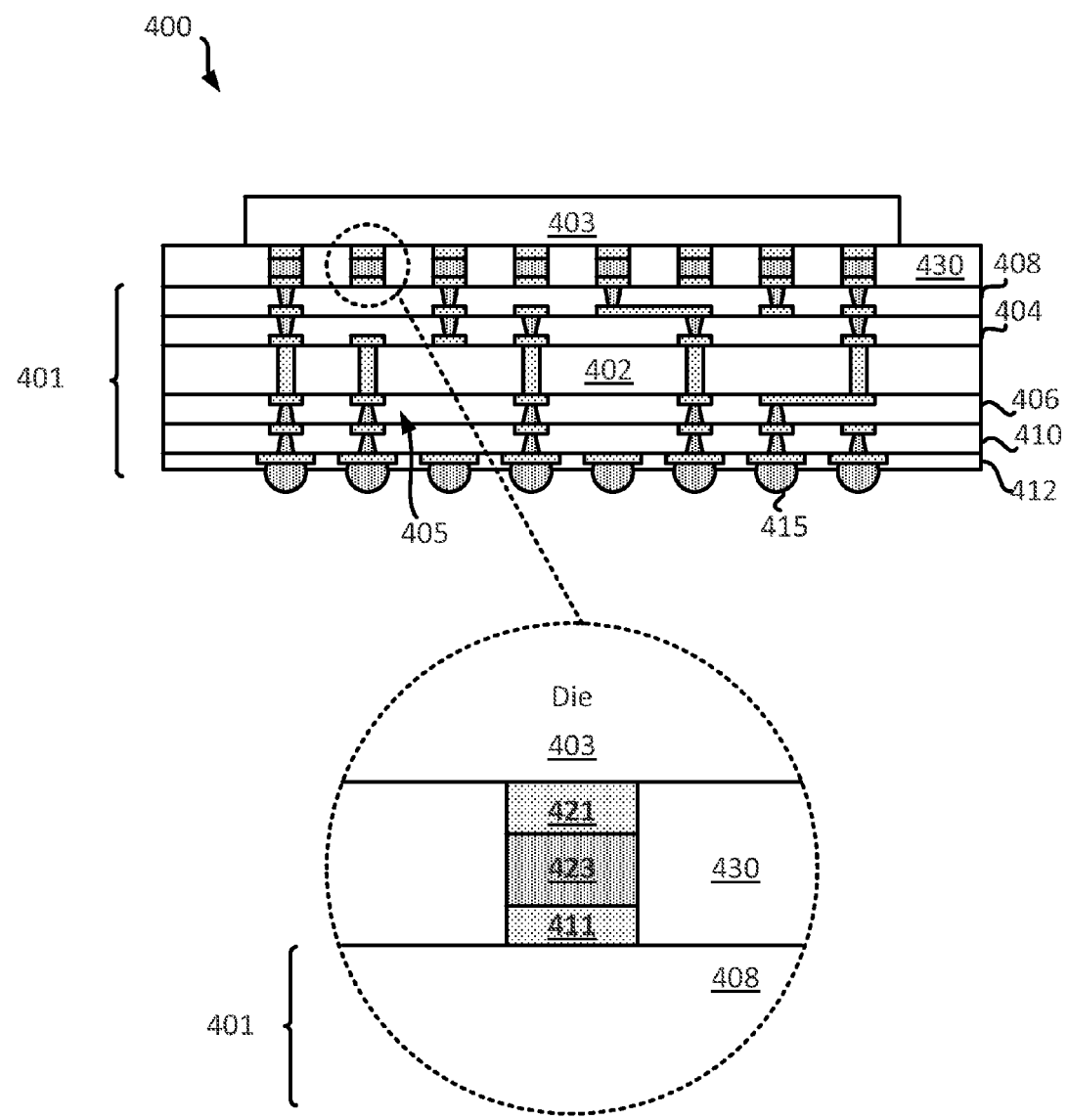
FIG. 4 illustrates an example of a profile view of a cross section of an integrated device package that includes a photosensitive fill.

FIG. 4 illustrates an integrated device package that includes a photosensitive fill. Specifically, FIG. 4 illustrates an integrated device package 400 that includes a substrate 401, a die 403, and a fill 430. The substrate 401 may be a package substrate and/or an interposer. The substrate 401 includes several dielectric layers (e.g., dielectric layers 402, 404, 406, 408, 410), several interconnects (e.g., traces, vias, pads) 405, a solder resist layer 412 and a set of solder balls 415. The substrate 401 may be a substrate that includes a core layer (e.g., where dielectric layer 402 is a core layer), or the substrate 401 may be a coreless substrate. The substrate 401 may include an interconnect 411 (e.g., substrate interconnect). The interconnect 411 may be a surface interconnect located on the surface of the substrate 401 (e.g., on the surface of dielectric layer 408 of the substrate). The interconnect 411 may be a trace and/or a pad. The substrate 401 may include several interconnects 411.

As shown in FIG. 4, the die 403 is coupled to the substrate 401 through a pillar 421, a conductive interconnect 423, and the interconnect 411. It should be noted that the die 403 may be coupled to the substrate 401 through several pillars 421, several conductive interconnects 423, and several interconnects 411. The pillar 421 is coupled to the die 403. The pillar 421 is coupled (e.g., electrically coupled) to an interconnect (e.g., redistribution interconnect, under bump metallization (UBM) layer) of the die 403. In some implementations, the pillar 421 is part of the die 403. The pillar 421 may be a die interconnect. The pillar 421 may have different shapes and sizes. The pillar 421 may be a metal layer (e.g., a copper pillar). The fill 430 is located between the package substrate 401 and the die 403. The fill 430 encapsulates the pillar 421, the conductive interconnect 423, and the interconnect 411. The fill 430 is a non-conductive layer and/or non-conductive film. In some implementations, the fill 430 is a photosensitive fill. A photosensitive fill may be a material that is photo patternable, photo-lithographable and/or photo-etchable. For example, a photosensitive fill may be a material that can be removed (e.g., washed away) once the photosensitive fill is exposed to a light (e.g., UV light).

The conductive interconnect 423 (e.g., electrically conductive interconnect) is coupled to the pillar 421 and the interconnect 411. Different implementations may use different materials for the conductive interconnect 423. In some implementations, the conductive interconnect 423 is a paste (e.g., copper paste) and/or solder (e.g., cured solder, enhanced solder comprising a polymeric material).

As shown in FIG. 4, the conductive interconnect 423 has a dimension (e.g., width, diameter) that is about the same (e.g., equal) or less than a dimension (e.g., die interconnect width) of the pillar 421 and/or a dimension of the interconnect 411. In some implementations, at least a majority (e.g., more than half, substantially all, entire) of the conductive interconnect 423 has a dimension that is about the same or less than a dimension (e.g., die interconnect width) of the pillar 421 (e.g., die interconnect) and/or a dimension of the interconnect 411. Unlike conventional processes that produce an elongated solder, the dimensions of the conductive interconnect 423 is controlled and/or defined by the fill 430. Specifically, the conductive interconnect 423 is defined in a cavity of the fill 430, which as described above may be a non-conducting layer/non-conducting film. How the conductive interconnect 423 is formed is further described below in at least FIGS. 14A-14B. In some implementations, the pitch of the pillar 421, the conductive interconnect 423, and/or the interconnect 411 is about 40 microns (μm) or less. A pitch is defined as a center to center distance between two neighboring and/or adjacent interconnects pillars, and/or conductive interconnects.

As a result of the above design of the conductive interconnect 423 in the fill 430, the conductive interconnect 423 will not contact another conductive interconnect or interconnect. Additionally, in contrast to conventional methods, the above design reduces or eliminates excess material, thereby resulting in a lower cost product and/or device.

In some implementations, a die may be coupled to an interconnect that is embedded in a surface of the substrate.

Figure 5:
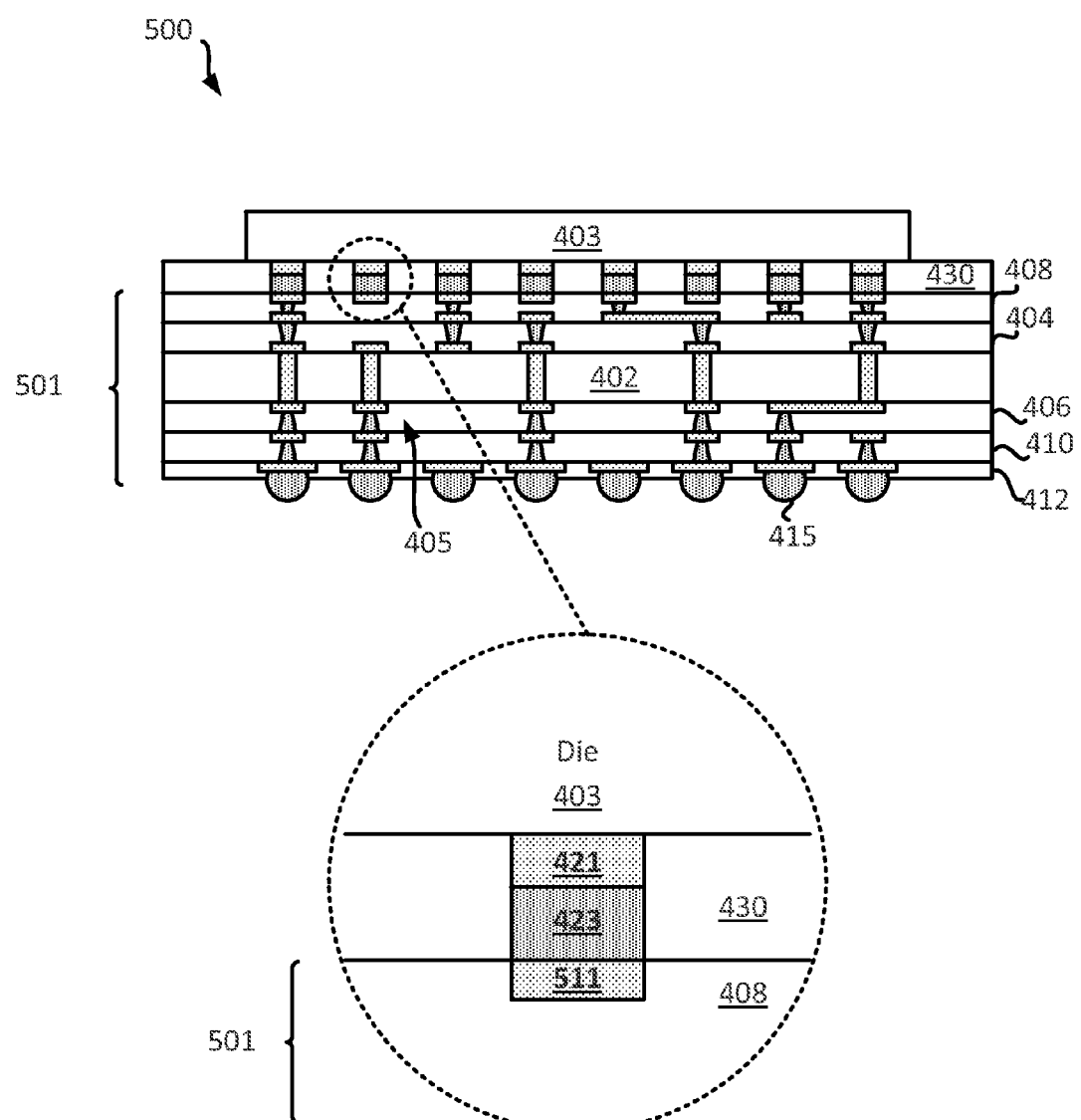
FIG. 5 illustrates an example of a profile view of a cross section of an integrated device package that includes a photosensitive fill.

FIG. 5 illustrates an integrated device package 500 that includes a substrate 501, the die 403, and the fill 430. The substrate 501 may be a package substrate and/or an interposer. The substrate 501 includes several dielectric layers (e.g., dielectric layers 402, 404, 406, 408, 410), several interconnects (e.g., traces, vias, pads) 405, a solder resist layer 412 and a set of solder balls 415. The substrate 501 may be a substrate that includes a core layer (e.g., where dielectric layer 402 is a core layer), or the substrate 401 may be a coreless substrate. The substrate 401 may include an interconnect 511 (e.g., substrate interconnect). The interconnect 511 may be an embedded interconnect located at least (e.g., partially, completely) in the surface of the substrate 401 (e.g., in the dielectric layer 408 of the substrate). The interconnect 511 may be a trace and/or a pad. The substrate 501 may include several interconnects 511.

As shown in FIG. 5, the die 403 is coupled to the substrate 501 through the pillar 421, the conductive interconnect 423, and the interconnect 511. It should be noted that the die 403 may be coupled to the substrate 501 through several pillars 421, several conductive interconnects 423, and several interconnects 511. The pillar 421 is coupled to the die 403. The pillar 421 may be a die interconnect. The pillar 421 may be a metal layer (e.g., a copper pillar). The fill 430 is located between the package substrate 501 and the die 403. The fill 430 encapsulates the pillar 421, the conductive interconnect 423, and the interconnect 511. The fill 430 is a non-conductive layer and/or non-conductive film. In some implementations, the fill 430 is a photosensitive fill. A photosensitive fill may be a material that is photo patternable, photo-lithographable and/or photo-etchable. For example, a photosensitive fill may be a material that can be removed (e.g., washed away) once the photosensitive fill is exposed to a light (e.g., UV light).

The conductive interconnect 423 (e.g., electrically conductive interconnect) is coupled to the pillar 421 and the interconnect 511. Different implementations may use different materials for the conductive interconnect 423. In some implementations, the conductive interconnect 423 is a paste (e.g., copper paste) and/or solder (e.g., cured solder, enhanced solder comprising a polymeric material).

As shown in FIG. 5, the conductive interconnect 423 has a dimension (e.g., width, diameter) that is about the same (e.g., equal) or less than a dimension (e.g., die interconnect width) of the pillar 421 and/or a dimension of the interconnect 511. In some implementations, at least a majority (e.g., more than half, substantially all, entire) of the conductive interconnect 423 has a dimension that is about the same or less than a dimension (e.g., die interconnect width) of the pillar 421 (e.g., die interconnect) and/or a dimension of the interconnect 511. Unlike conventional processes that produce an elongated solder, the dimensions of the conductive interconnect 423 is controlled and/or defined by the fill 430. Specifically, the conductive interconnect 423 is defined in a cavity of the fill 430, which as described above may be a non-conducting layer/non-conducting film. How the conductive interconnect 423 is formed is further described below in at least FIGS. 14A-14B. In some implementations, the pitch of the pillar 421, the conductive interconnect 423, and/or the interconnect 511 is about 40 microns (μm) or less. A pitch is defined as a center to center distance between two neighboring and/or adjacent interconnects pillars, and/or conductive interconnects.

As a result of the above design of the conductive interconnect 423 in the fill 430, the conductive interconnect 423 will not contact another conductive interconnect or interconnect. Additionally, in contrast to conventional integrated device packages, the above design reduces or eliminates excess material, thereby resulting in a lower cost product, device and/or package.

Figure 6:
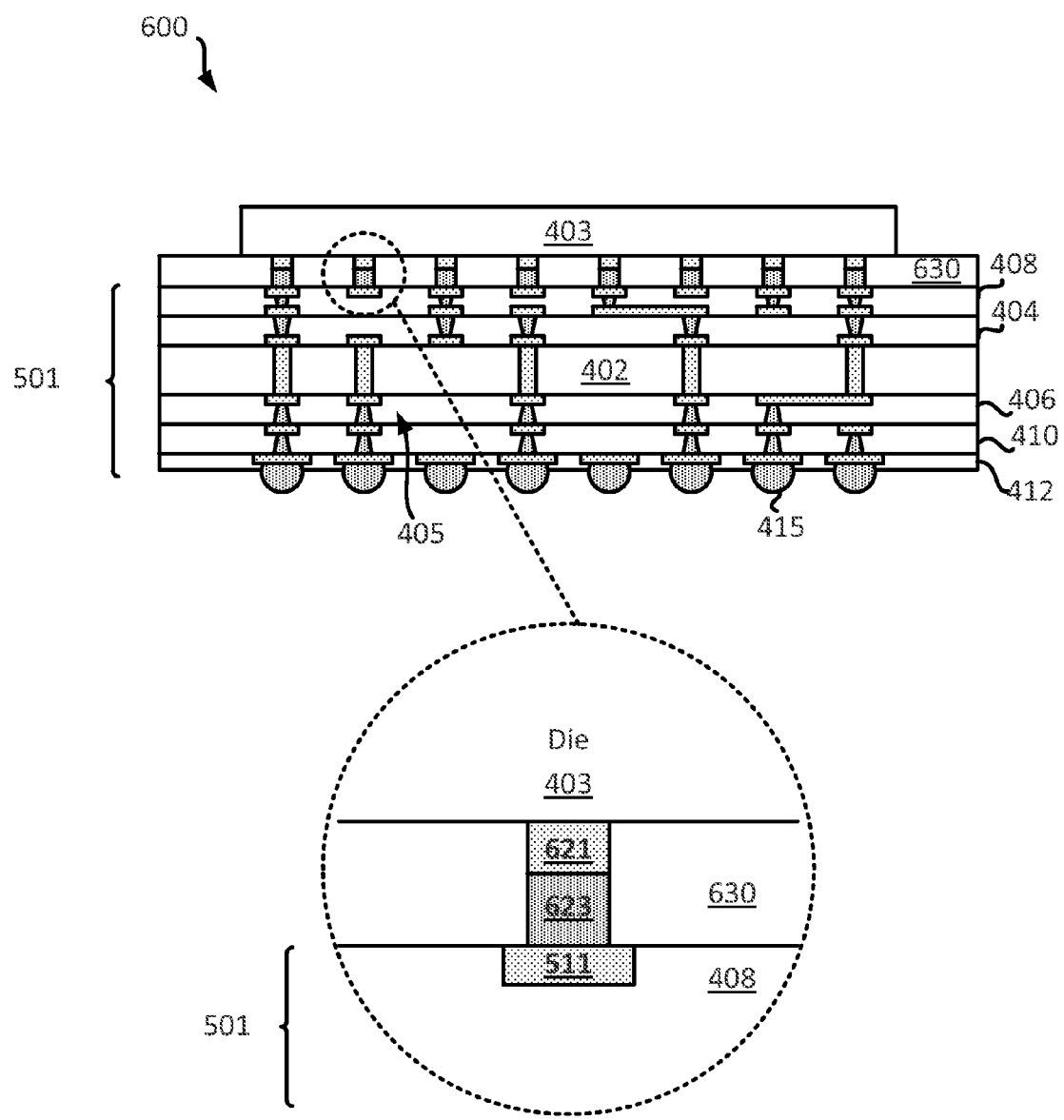
FIG. 6 illustrates an example of a profile view of a cross section of an integrated device package that includes a photosensitive fill.

In some implementations, a pillar of a die may have different dimensions than the dimensions of an interconnect coupled to a substrate. FIG. 6 illustrates an integrated device package 600 that includes the substrate 501, the die 403, and the fill 630. The substrate 501 may be a package substrate and/or an interposer. The substrate 501 includes several dielectric layers (e.g., dielectric layers 402, 404, 406, 408, 410), several interconnects (e.g., traces, vias, pads) 405, a solder resist layer 412 and a set of solder balls 415. The substrate 501 may be a substrate that includes a core layer (e.g., where dielectric layer 402 is a core layer), or the substrate 501 may be a coreless substrate. The substrate 501 may include the interconnect 511 (e.g., substrate interconnect). The interconnect 511 may be an embedded interconnect located at least (e.g., partially, completely) in the surface of the substrate 501 (e.g., in the dielectric layer 408 of the substrate). The interconnect 511 may be a trace and/or a pad.

As shown in FIG. 6, the die 403 is coupled to the substrate 501 through the pillar 621, the conductive interconnect 623, and the interconnect 511. It should be noted that the die 403 may be coupled to the substrate 501 through several pillars 621, several conductive interconnects 623, and several interconnects 511. The pillar 621 is coupled to the die 403. The pillar 621 is coupled (e.g., electrically coupled) to an interconnect (e.g., redistribution interconnect, under bump metallization (UBM) layer) of the die 403. In some implementations, the pillar 621 is part of the die 403. The pillar 621 may be a die interconnect. The pillar 621 may have different shapes and sizes. The pillar 621 may be a metal layer (e.g., a copper pillar). The fill 630 is located between the package substrate 501 and the die 403. The fill 630 encapsulates the pillar 621, the conductive interconnect 623, and the interconnect 511. The fill 630 is a non-conductive layer and/or non-conductive film. In some implementations, the fill 630 is a photosensitive fill. A photosensitive fill may be a material that is photo patternable, photo-lithographable and/or photo-etchable. For example, a photosensitive fill may be a material that can be removed (e.g., washed away) once the photosensitive fill is exposed to a light (e.g., UV light).

The conductive interconnect 623 (e.g., electrically conductive interconnect) is coupled to the pillar 621 and the interconnect 511. Different implementations may use different materials for the conductive interconnect 623. In some implementations, the conductive interconnect 623 is a paste (e.g., copper paste) and/or solder (e.g., cured solder, enhanced solder comprising a polymeric material).

Figure 1:
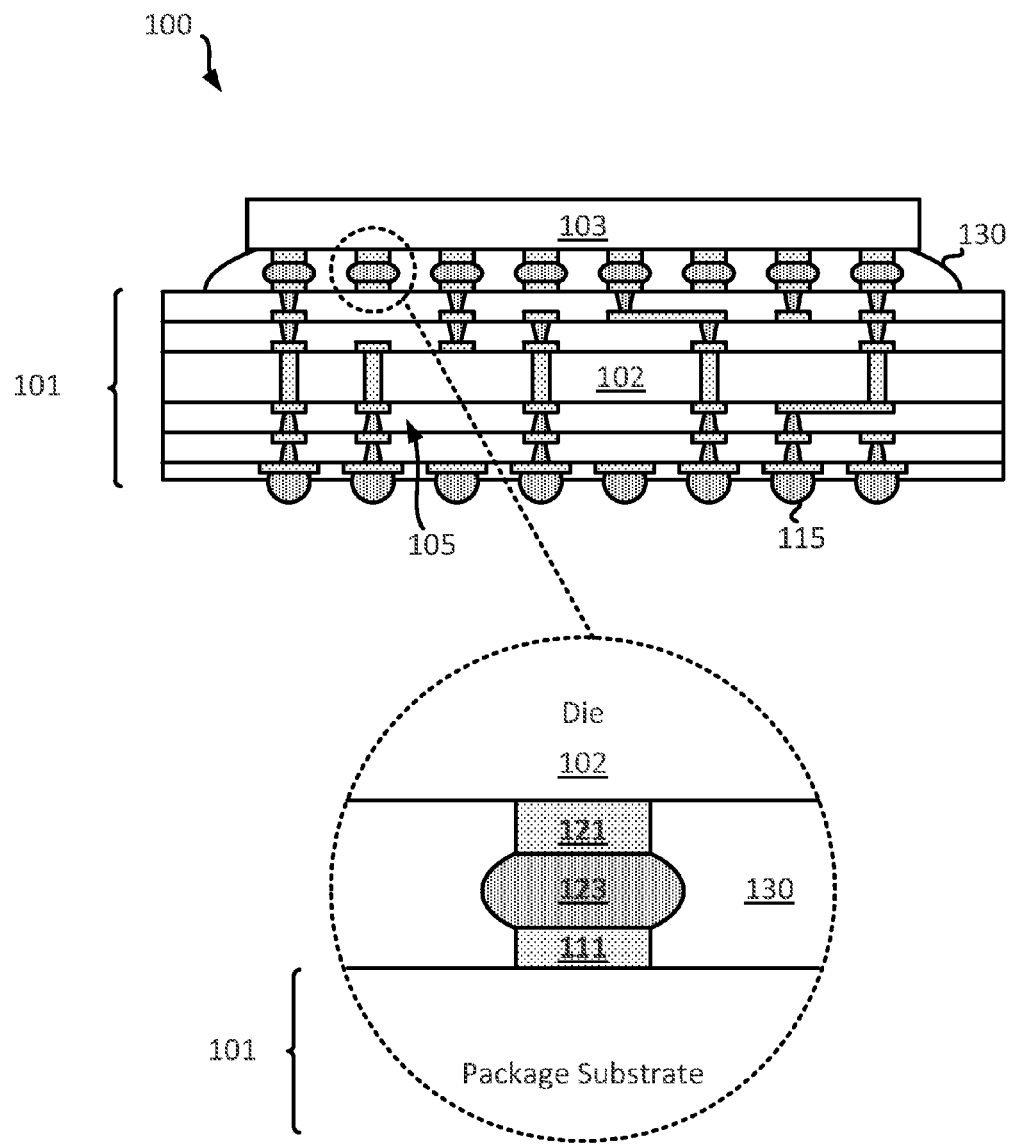
FIG. 1 illustrates a conventional integrated device package.
Figure 2:
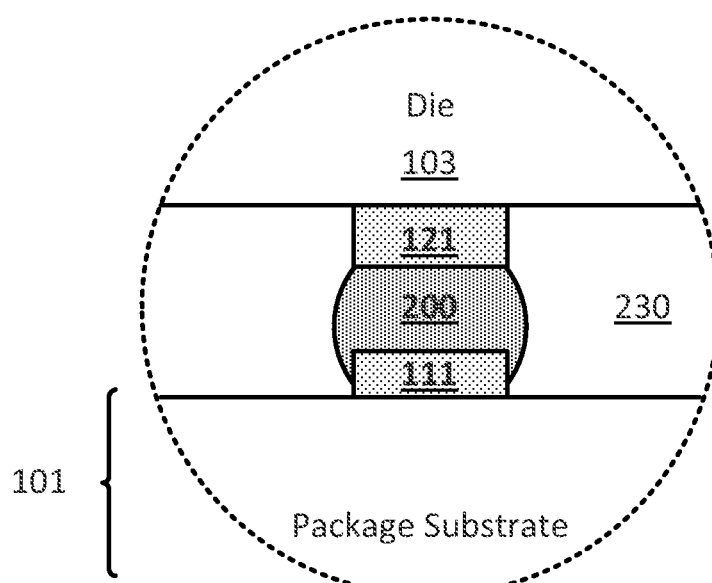
FIG. 2 illustrates a close up view of how a die is coupled to a substrate through a solder.
Figure 3:
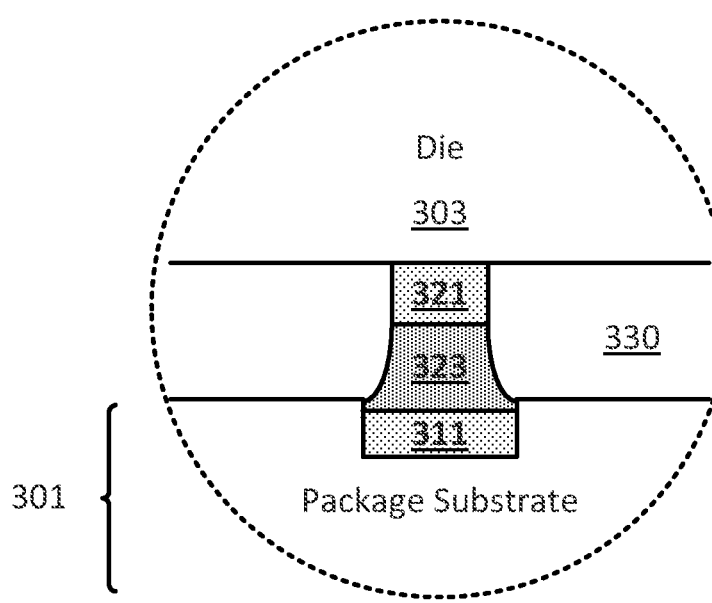
FIG. 3 illustrates a close up view of how a die is coupled to a substrate through a solder.

As shown in FIG. 6, the conductive interconnect 623 has a first dimension (e.g., width, diameter) that is about the same (e.g., equal) or less than a first dimension (e.g., die interconnect width) of the pillar 621 (e.g., die interconnect). In some implementations, at least a majority (e.g., more than half, substantially all, entire) of the conductive interconnect 623 has a dimension that is about the same or less than a dimension of the pillar 621 and/or a dimension of the interconnect 511. In addition, the conductive interconnect 623 has a first dimension that is less than a second dimension of the interconnect 511. In this example, the interconnect 511 has a greater dimension (e.g., width, diameter) than both the pillar 621 and the conductive interconnect 623. Unlike conventional processes that produce a solder that completely wets to the entire surface of the interconnect (e.g., trace, pad) on the substrate (see FIG. 3), the dimensions of the conductive interconnect 623 is controlled and/or defined by the fill 630, which limits the conductive interconnect 623 to only wet (e.g., physically couple) to a portion of the interconnect 511. Specifically, the conductive interconnect 623 is defined in a cavity of the fill 630, which as described above may be a non-conducting layer/non-conducting film. How the conductive interconnect 623 is formed is further described below in at least FIGS. 14A-14B. In some implementations, the pitch of the pillar 621, the conductive interconnect 623, and/or the interconnect 511 is about 40 microns (μm) or less.

In some implementations, a die may be coupled to an interconnect that is embedded in a surface of the substrate, where the embedded interconnect is offset from the surface of the substrate.

Figure 7:
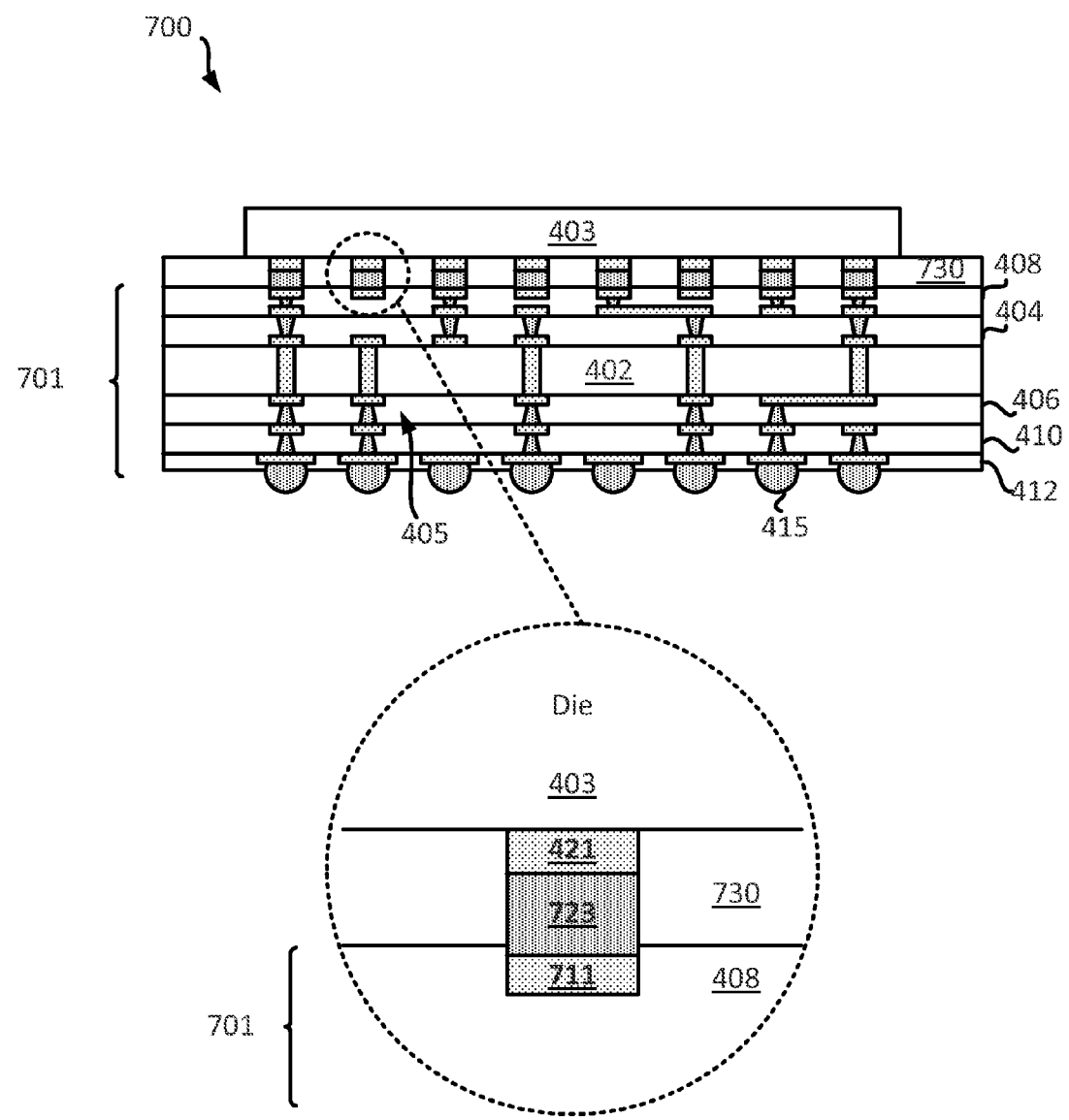
FIG. 7 illustrates an example of a profile view of a cross section of an integrated device package that includes a photosensitive fill.

FIG. 7 illustrates an integrated device package 700 that includes a substrate 701, the die 403, and the fill 730. The substrate 701 may be a package substrate and/or an interposer. The substrate 701 includes several dielectric layers (e.g., dielectric layers 402, 404, 406, 408, 410), several interconnects (e.g., traces, vias, pads) 405, a solder resist layer 412 and a set of solder balls 415. The substrate 701 may be a substrate that includes a core layer (e.g., where dielectric layer 402 is a core layer), or the substrate 401 may be a coreless substrate. The substrate 401 may include an interconnect 711 (e.g., substrate interconnect). The interconnect 711 may be an embedded interconnect located at least (e.g., completely) in the surface of the substrate 701 (e.g., in the dielectric layer 408 of the substrate). The interconnect 711 is embedded in the surface of the substrate such that the interconnect 711 is offset from the surface of the substrate 401 (e.g., offset from the surface of the dielectric layer 408 of the substrate). The interconnect 711 may be a trace and/or a pad. The substrate 701 may include several interconnects 711.

As shown in FIG. 7, the die 403 is coupled to the substrate 701 through the pillar 421, the conductive interconnect 723, and the interconnect 711. It should be noted that the die 403 may be coupled to the substrate 701 through several pillars 421, several conductive interconnects 723, and several interconnects 711. The pillar 421 is coupled to the die 403. The pillar 621 may be a die interconnect. The pillar 421 may be a metal layer (e.g., a copper pillar). The fill 730 is located between the package substrate 701 and the die 403. The fill 730 encapsulates the pillar 421, the conductive interconnect 723, and the interconnect 711. The fill 730 is a non-conductive layer and/or non-conductive film. In some implementations, the fill 730 is a photosensitive fill A photosensitive fill may be a material that is photo patternable, photo-lithographable and/or photo-etchable. For example, a photosensitive fill may be a material that can be removed (e.g., washed away) once the photosensitive fill is exposed to a light (e.g., UV light).

The conductive interconnect 723 (e.g., electrically conductive interconnect) is coupled to the pillar 421 and the interconnect 711. Different implementations may use different materials for the conductive interconnect 723. In some implementations, the conductive interconnect 723 is a paste (e.g., copper paste) and/or solder (e.g., cured solder, enhanced solder comprising a polymeric material). The conductive interconnect 723 is coupled to the embedded interconnect 711 such that at least part of the conductive interconnect 723 is at least partially embedded in the substrate 701 (e.g., at least partially embedded in the dielectric layer 408 of the substrate 701).

As shown in FIG. 7, the conductive interconnect 723 has a dimension (e.g., width, diameter) that is about the same (e.g., equal) or less than a dimension (e.g., die interconnect width) of the pillar 421 and/or a dimension of the interconnect 711. In some implementations, at least a majority (e.g., more than half, substantially all, entire) of the conductive interconnect 723 has a dimension that is about the same or less than a dimension of the pillar 421 and/or a dimension of the interconnect 711. Unlike conventional processes that produce an elongated solder, the dimensions of the conductive interconnect 723 is controlled and/or defined by the fill 730. Specifically, the conductive interconnect 723 is defined in a cavity of the fill 730, which as described above may be a non-conducting layer/non-conducting film. How the conductive interconnect 723 is formed is further described below in at least FIGS. 14A-14B. In some implementations, the pitch of the pillar 421, the conductive interconnect 723, and/or the interconnect 711 is about 40 microns (μm) or less.

As a result of the above design of the conductive interconnect 723 in the fill 730, the conductive interconnect 723 will not contact another conductive interconnect or interconnect. Additionally, in contrast to conventional integrated device packages, the above design reduces or eliminates excess material, thereby resulting in a lower cost product, device and/or package.

Figure 8:
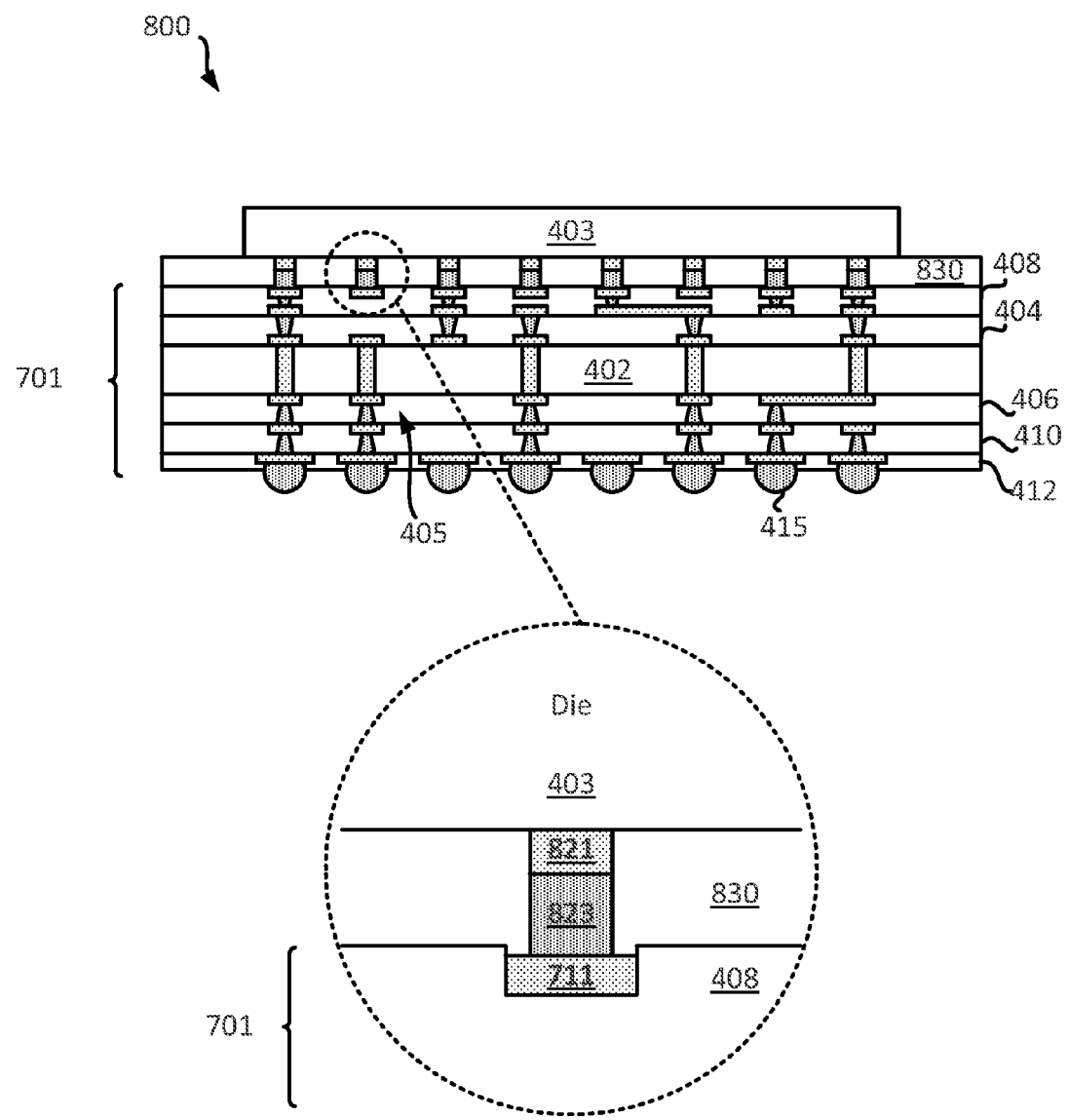
FIG. 8 illustrates an example of a profile view of a cross section of an integrated device package that includes a photosensitive fill.
Figure 9:
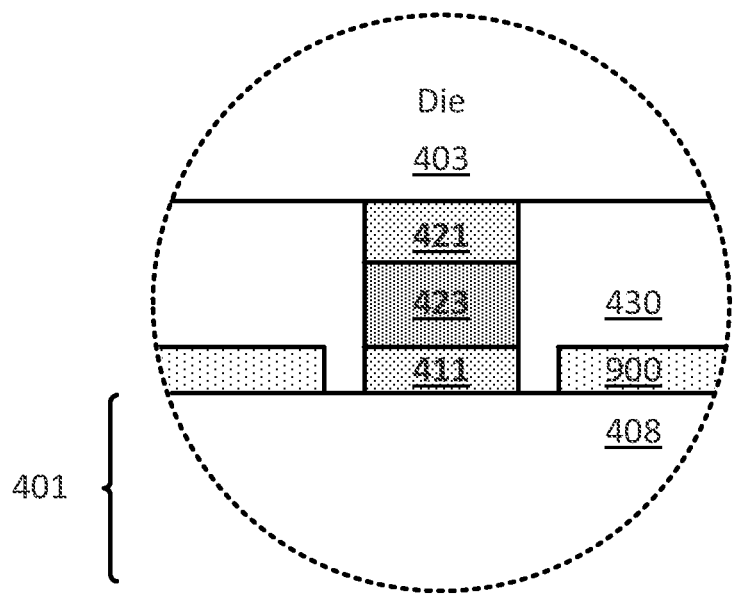
FIG. 9 illustrates a portion of an integrated device package that includes a solder resist layer on a substrate.
Figure 10:
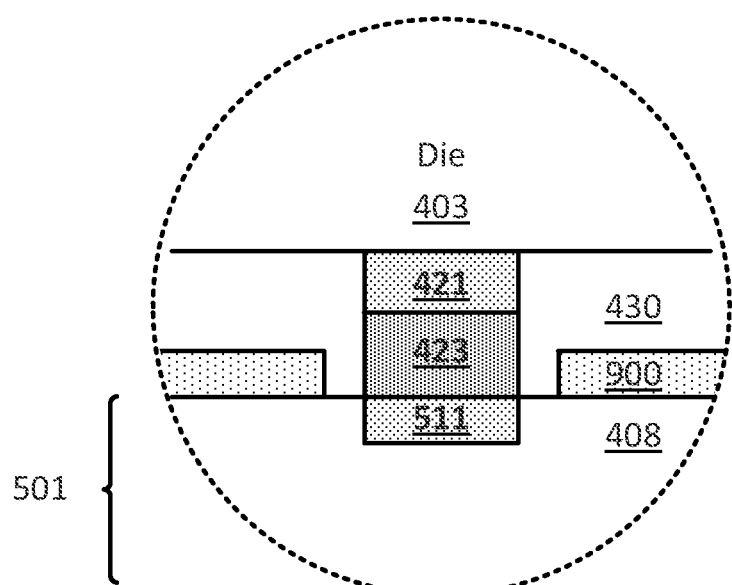
FIG. 10 illustrates a portion of another integrated device package that includes a solder resist layer on a substrate.
Figure 11:
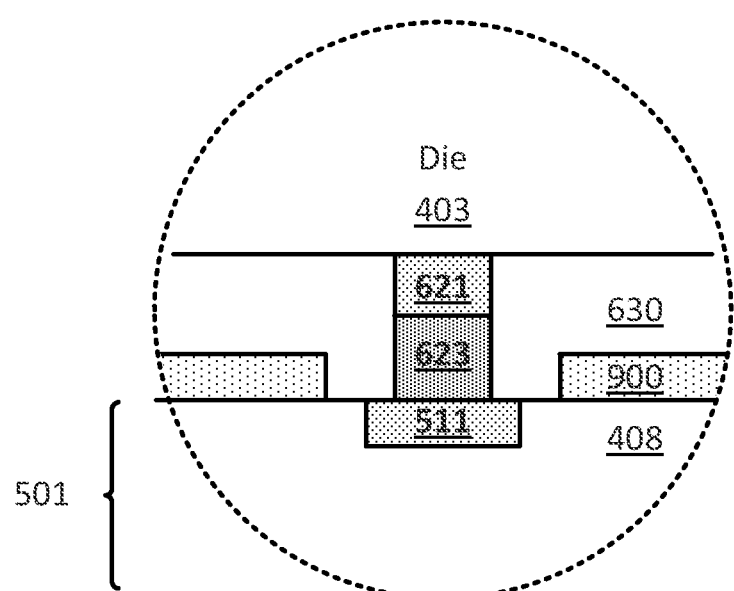
FIG. 11 illustrates a portion of an integrated device package that includes a solder resist layer on a substrate.
Figure 12:
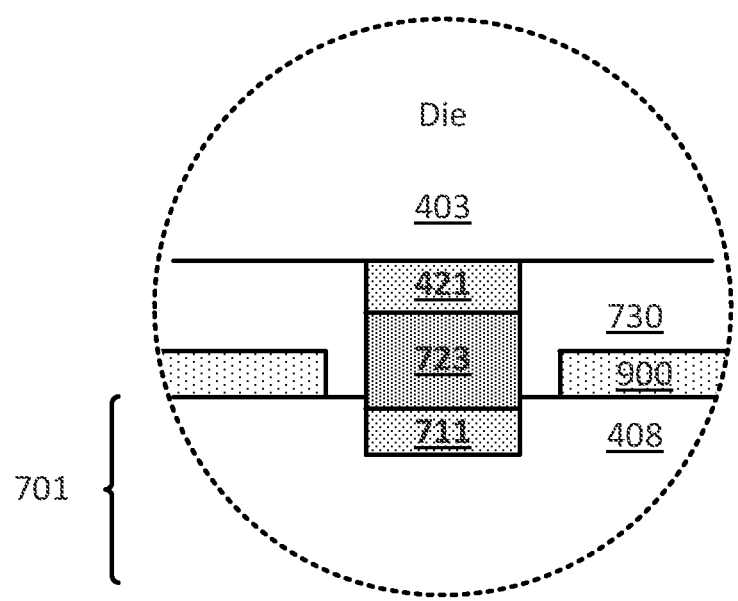
FIG. 12 illustrates a portion of another integrated device package that includes a solder resist layer on a substrate.
Figure 13:
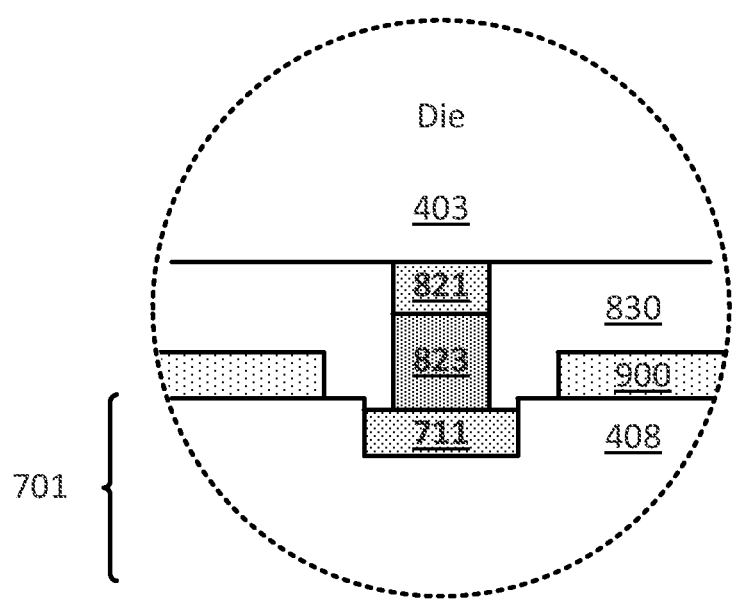
FIG. 13 illustrates a portion of an integrated device package that includes a solder resist layer on a substrate.

In some implementations, a pillar of a die may have different dimensions than the dimensions of an embedded interconnect in a substrate. FIG. 8 illustrates an integrated device package 800 that includes the substrate 701, the die 403, and the fill 830. The substrate 701 may be a package substrate and/or an interposer. The substrate 701 includes several dielectric layers (e.g., dielectric layers 402, 404, 406, 408, 410), several interconnects (e.g., traces, vias, pads) 405, a solder resist layer 412 and a set of solder balls 415. The substrate 701 may be a substrate that includes a core layer (e.g., where dielectric layer 402 is a core layer), or the substrate 701 may be a coreless substrate. The substrate 701 may include the interconnect 711 (e.g., substrate interconnect). The interconnect 711 may be an embedded interconnect located at least (e.g., partially, completely) in the surface of the substrate 701 (e.g., in the dielectric layer 408 of the substrate). The interconnect 711 is embedded in the surface of the substrate such that the interconnect 711 is offset from the surface of the substrate 701 (e.g., offset from the surface of the dielectric layer 408 of the substrate). The interconnect 711 may be a trace and/or a pad.

As shown in FIG. 8, the die 403 is coupled to the substrate 701 through the pillar 821, the conductive interconnect 823, and the interconnect 711. It should be noted that the die 403 may be coupled to the substrate 701 through several pillars 821, several conductive interconnects 823, and several interconnects 711. The pillar 821 is coupled to the die 403. The pillar 821 may be a die interconnect. The pillar 821 is coupled (e.g., electrically coupled) to an interconnect (e.g., redistribution interconnect, under bump metallization (UBM) layer) of the die 403. In some implementations, the pillar 821 is part of the die 403. The pillar 821 may have different shapes and sizes. The pillar 821 may be a metal layer (e.g., a copper pillar). The fill 830 is located between the package substrate 701 and the die 403. The fill 830 encapsulates the pillar 821, the conductive interconnect 823, and the interconnect 711. The fill 830 is a non-conductive layer and/or non-conductive film. In some implementations, the fill 830 is a photosensitive fill. A photosensitive fill may be a material that is photo patternable, photo-lithographable and/or photo-etchable. For example, a photosensitive fill may be a material that can be removed (e.g., washed away) once the photosensitive fill is exposed to a light (e.g., UV light).

The conductive interconnect 823 (e.g., electrically conductive interconnect) is coupled to the pillar 821 and the interconnect 711. Different implementations may use different materials for the conductive interconnect 823. In some implementations, the conductive interconnect 823 is a paste (e.g., copper paste) and/or solder (e.g., cured solder, enhanced solder comprising a polymeric material). The conductive interconnect 823 is coupled to the embedded interconnect 711 such that at least part of the conductive interconnect 823 is at least partially embedded in the substrate 701 (e.g., at least partially embedded in the dielectric layer 408 of the substrate 701).

As shown in FIG. 8, the conductive interconnect 823 has a first dimension (e.g., width, diameter) that is about the same (e.g., equal) or less than a first dimension (e.g., die interconnect width) of the pillar 821 (e.g., die interconnect). In some implementations, at least a majority (e.g., more than half, substantially all, entire) of the conductive interconnect 823 has a dimension that is about the same or less than a dimension of the pillar 821 and/or a dimension of the interconnect 711. In addition, the conductive interconnect 823 has a first dimension that is less than a second dimension of the interconnect 711. In this example, the interconnect 711 has a greater dimension (e.g., width, diameter) than both the pillar 821 and the conductive interconnect 823. Unlike conventional processes that produce a solder that completely wets to the entire surface of the interconnect (e.g., trace, pad) on the substrate (see FIG. 3), the dimensions of the conductive interconnect 823 is controlled and/or defined by the fill 830, which limits the conductive interconnect 823 to only wet (e.g., physically couple) to a portion of the interconnect 711. Specifically, the conductive interconnect 823 is defined in a cavity of the fill 830, which as described above may be a non-conducting layer/non-conducting film. How the conductive interconnect 823 is formed is further described below in at least FIGS. 14A-14B. In some implementations, the pitch of the pillar 821, the conductive interconnect 823, and/or the interconnect 711 is about 40 microns (μm) or less.

In some implementations, a solder resist (SR) layer may be located between the die 403 and the substrate (e.g., substrates 401, 501, 601, 701, 801). FIGS. 9-13 illustrate a solder resist layer 900 located between the die 403 and a substrate. In some implementations, the solder resist layer 900 is part of the substrate. As shown in FIGS. 9-13, the solder resist layer 900 is located on the dielectric layer 408.

Having described several integrated device packages comprising a photosensitive fill, a sequence and method for providing and/or fabricating such an integrated device package will now be described below.

Figure 14A:
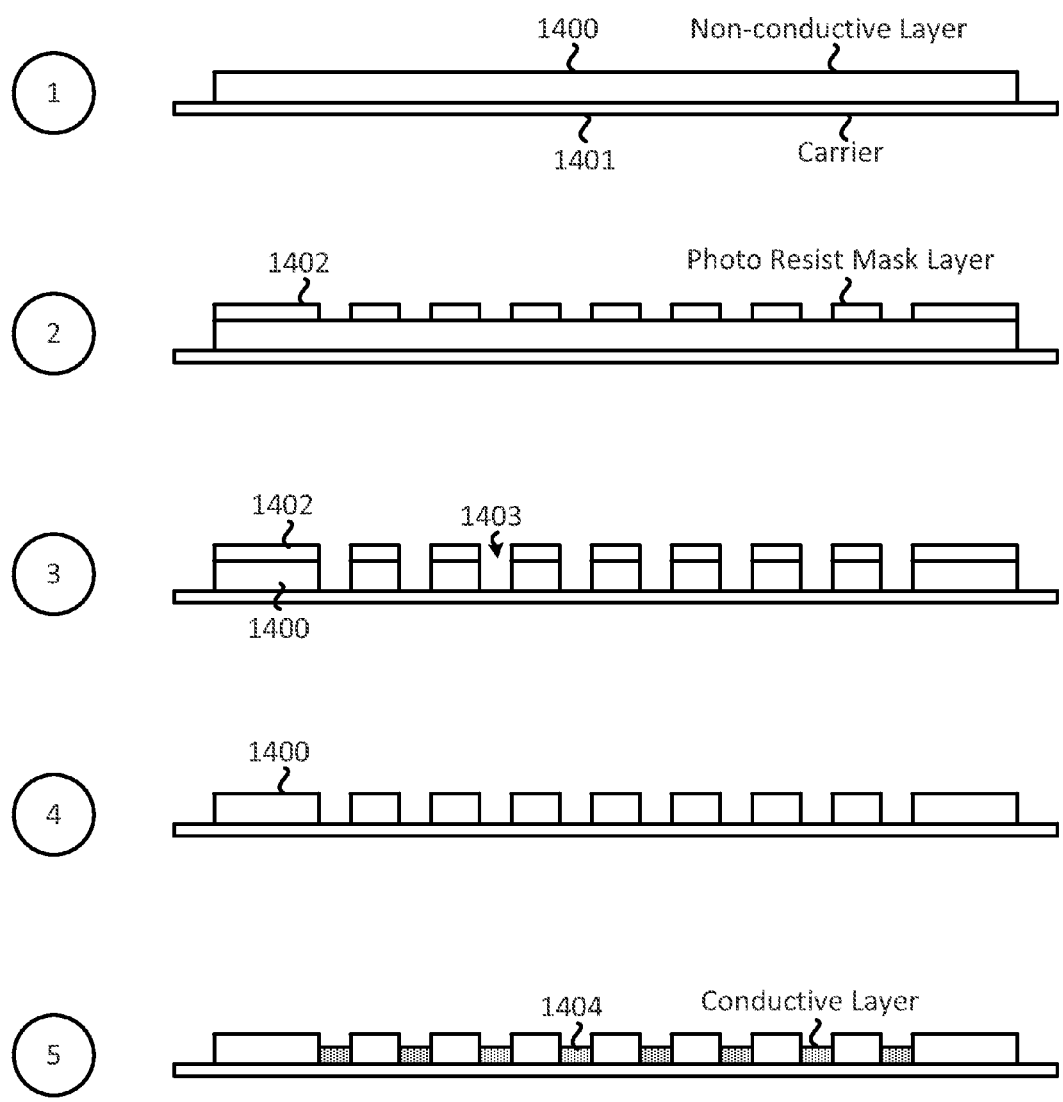
FIG. 14 (which includes FIGS. 14A-14B) illustrates an exemplary sequence for providing/fabricating integrated device package that includes a photosensitive fill.
Figure 14B:
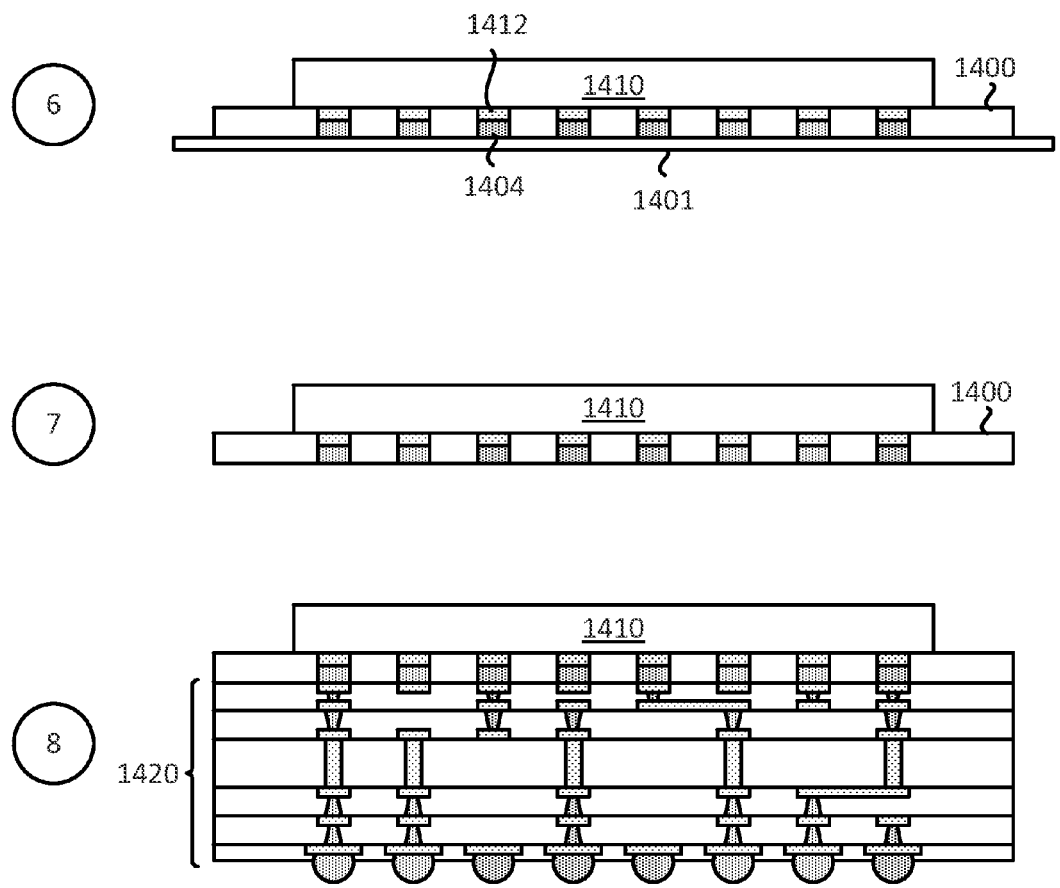

Exemplary Sequence for Providing/Fabricating an Integrated Device Package Comprising a Photosensitive Fill In some implementations, providing/fabricating an integrated device package that includes a photosensitive fill includes several processes. FIG. 14 (which includes FIGS. 14A-14B) illustrates an exemplary sequence for providing/fabricating an integrated device package that includes a photosensitive fill. In some implementations, the sequence of FIGS. 14A-14B may be used to provide/fabricate the integrated device package of FIGS. 4-8 and/or other integrated device packages described in the present disclosure. However, for the purpose of simplification, FIGS. 14A-14B will be described in the context of providing/fabricating the integrated device package of FIG. 6.

It should be noted that the sequence of FIGS. 14A-14B may combine one or more stages in order to simplify and/or clarify the sequence for providing an integrated device package. In some implementations, the order of the processes may be changed or modified.

Stage 1, as shown in FIG. 14A, illustrates a state after a non-conductive layer 1400 is provided and coupled to a carrier 1401. The non-conductive layer 1400 may be a photosensitive layer. A photosensitive layer may be a material that is photo-patternable, photo-lithographable, and/or photo-etchable. The non-conductive layer 1400 may be a non-conductive film. The non-conductive layer 1400 may be a fill.

Stage 2 illustrates a state after a photo resist mask layer 1402 is formed and coupled to the non-conductive layer 1400. The photo resist mask layer 1402 may include a pattern, as illustrated by the cavities in the photo resist mask layer 1402.

Stage 3 illustrates a state after cavities are formed in the non-conductive layer 1400. In some implementations, the cavities are formed after a photo-etching process (e.g., photo lithography process), where the non-conductive layer 1400 is exposed to a light (e.g., UV light) through the photo resist mask layer 1402, and portions of the non-conductive layer 1400 are removed (e.g., washed away).

Stage 4 illustrates a state after the photo resist mask layer 1402 is uncoupled (e.g., removed, lift off) from the non-conductive layer 1400, leaving the remaining non-conductive layer 1400 and the carrier 1401.

Stage 5 illustrates a state after a conductive interconnect 1404 is formed in the cavities (e.g., cavity 1403) of the non-conductive layer 1400. Different implementations may use different materials for the conductive interconnect 1404. In some implementations, the conductive interconnect 1404 is a paste (e.g., copper paste) and/or solder (e.g., cured solder, enhanced solder comprising a polymeric material). In some implementations, the conductive interconnect 1404 is formed in the cavities using a screen printing process. In some implementations, the conductive interconnect 1404 may be cured.

It should be noted that different implementations may provide different levels or amounts of conductive materials to form the conductive interconnect 1404. In some implementations, the cavities of the non-conductive layer 1400 are completely filled with the conductive material to form the conductive interconnect 1404. In other implementations, the cavities of the non-conductive layer 1400 are partially filled with the conductive material to form the conductive interconnect 1404. The conductive material in the cavities may move and shift within the cavities of the non-conductive layer 1400.

Stage 6, as shown in FIG. 14B, illustrates a state after a die 1410 comprising pillars 1412 is coupled to the non-conductive layer 1400 and the conductive interconnect 1404. The pillars 1412 are coupled to the conductive interconnect 1404.

Stage 7 illustrates a state after the carrier 1401 is uncoupled (e.g., removed, lift-off) from the non-conductive layer 1400 and the conductive interconnect 1404, leaving behind the die 1410, the pillars 1412, the non-conductive layer 1400 and the conductive interconnect 1404.

Stage 8 illustrates a state after the die 1410, the pillars 1412, the non-conductive layer 1400 and the conductive interconnect 1404 are coupled to a substrate 1420. The non-conductive layer 1400 may be a photosensitive fill. In some implementations, the substrate 1420 (e.g., package substrate, interposer) is similar to the substrate 501 as shown and described in FIGS. 5-6. As shown at stage 8, the conductive interconnect 1404 is coupled to an interconnect (e.g., substrate interconnect, surface interconnect, embedded interconnect) of the substrate, in a manner as described above in at least FIGS. 5-6.

Figure 15:
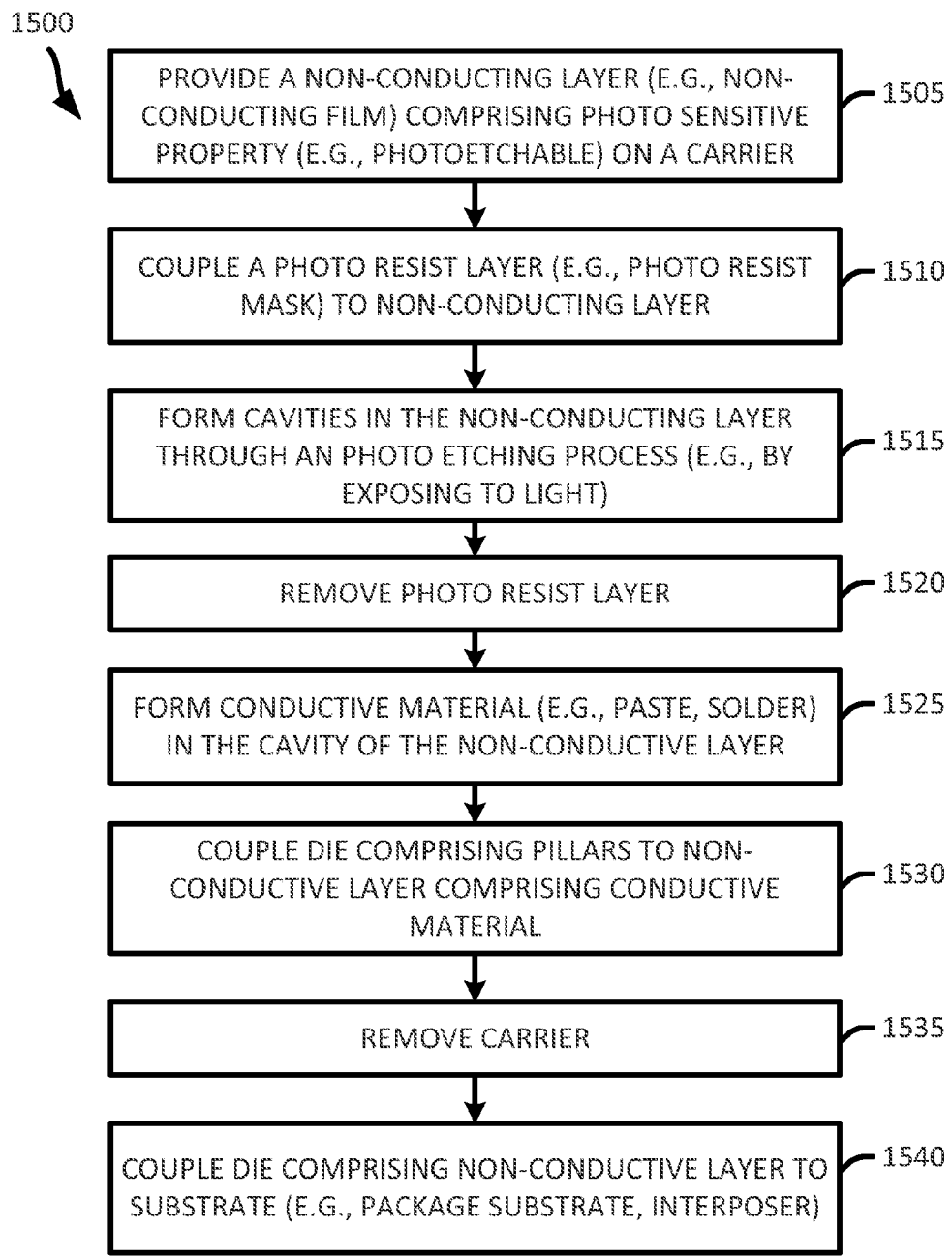
FIG. 15 illustrates an exemplary flow diagram of a method for providing/fabricating integrated device package that includes a photosensitive fill.

Exemplary Method for Providing/Fabricating an Integrated Device Package Comprising a Photosensitive Fill FIG. 15 illustrates an exemplary flow diagram of a method 1500 for providing/fabricating an integrated device package that includes a photosensitive fill. In some implementations, the method of FIG. 15 may be used to provide/fabricate the integrated device package that includes a photosensitive fill of FIGS. 4-8 and/or other capacitors in the present disclosure.

It should be noted that the flow diagram of FIG. 15 may combine one or more step and/or processes in order to simplify and/or clarify the method for providing an integrated device package. In some implementations, the order of the processes may be changed or modified.

The method provides (at 1505) provides a non-conductive layer and couples the non-conductive layer to a carrier. The non-conductive layer may be a photosensitive layer. A photosensitive layer may be a material that is photo-etchable. The non-conductive layer may be a non-conductive film.

The method couples (at 1510) a photo resist mask layer to the non-conductive layer. The photo resist mask layer may include a pattern.

The method also forms (at 1515) cavities in the non-conductive layer. In some implementations, the cavities are formed after a photo-etching process, where the non-conductive layer is exposed to a light (e.g., UV light) through the photo resist mask layer, and portions of the non-conductive layer are removed (e.g., washed away).

The method removes (at 1520) the photo resist mask layer, leaving the remaining non-conductive layer and the carrier.

The method then forms (at 1525) a conductive interconnect in the cavities of the non-conductive layer. Different implementations may use different materials for the conductive interconnect. In some implementations, the conductive interconnect is a paste (e.g., copper paste) and/or solder (e.g., cured solder, enhanced solder comprising a polymeric material). In some implementations, the conductive interconnect is formed in the cavities using a screen printing process. In some implementations, the conductive interconnect may be cured.

It should be noted that different implementations may provide different levels or amounts of conductive materials to form the conductive interconnect. In some implementations, the cavities of the non-conductive layer are completely filled with the conductive material to form the conductive interconnect. In other implementations, the cavities of the non-conductive layer are partially filled with the conductive material to form the conductive interconnect. The conductive material in the cavities may move and shift within the cavities of the non-conductive layer.

The method couples (at 1530) a die comprising pillars to the non-conductive layer and the conductive interconnect. The pillars of the die are coupled to the conductive interconnect.

The method removes (at 1535) the carrier, leaving behind the die, the pillars, the non-conductive layer and the conductive interconnect.

The method couples (at 1540) the die, the pillars, the non-conductive layer and the conductive interconnect to a substrate. The non-conductive layer may be a photosensitive fill. In some implementations, the substrate (e.g., package substrate, interposer) is similar to the substrate 501 as shown and described in FIGS. 5-6. The conductive interconnect is coupled to an interconnect (e.g., substrate interconnect surface interconnect, embedded interconnect) of the substrate, in a manner as described above in at least FIGS. 5-6.

Figure 16A:
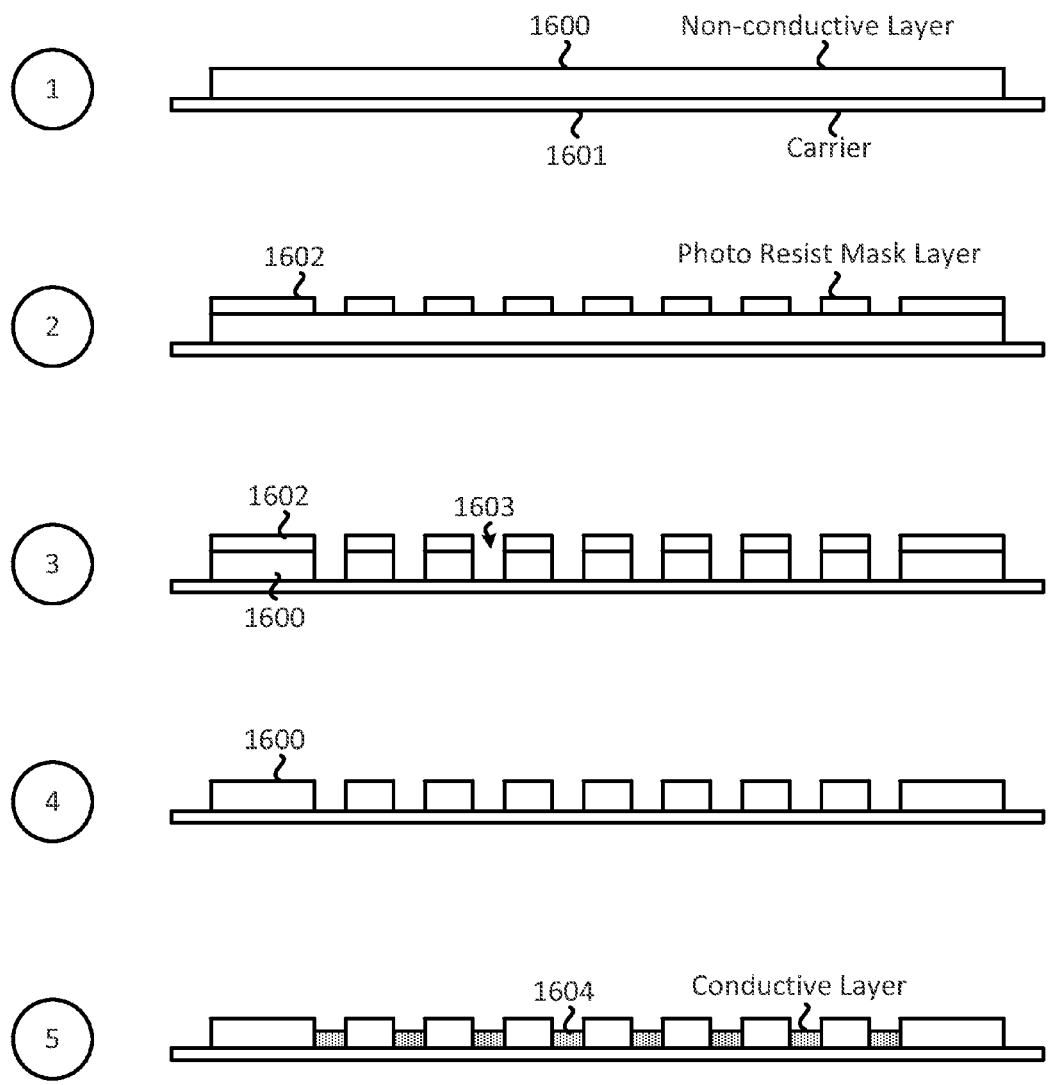
FIG. 16 (which includes FIGS. 16A-16B) illustrates an exemplary sequence for providing/fabricating integrated device package that includes a photosensitive fill.
Figure 16B:
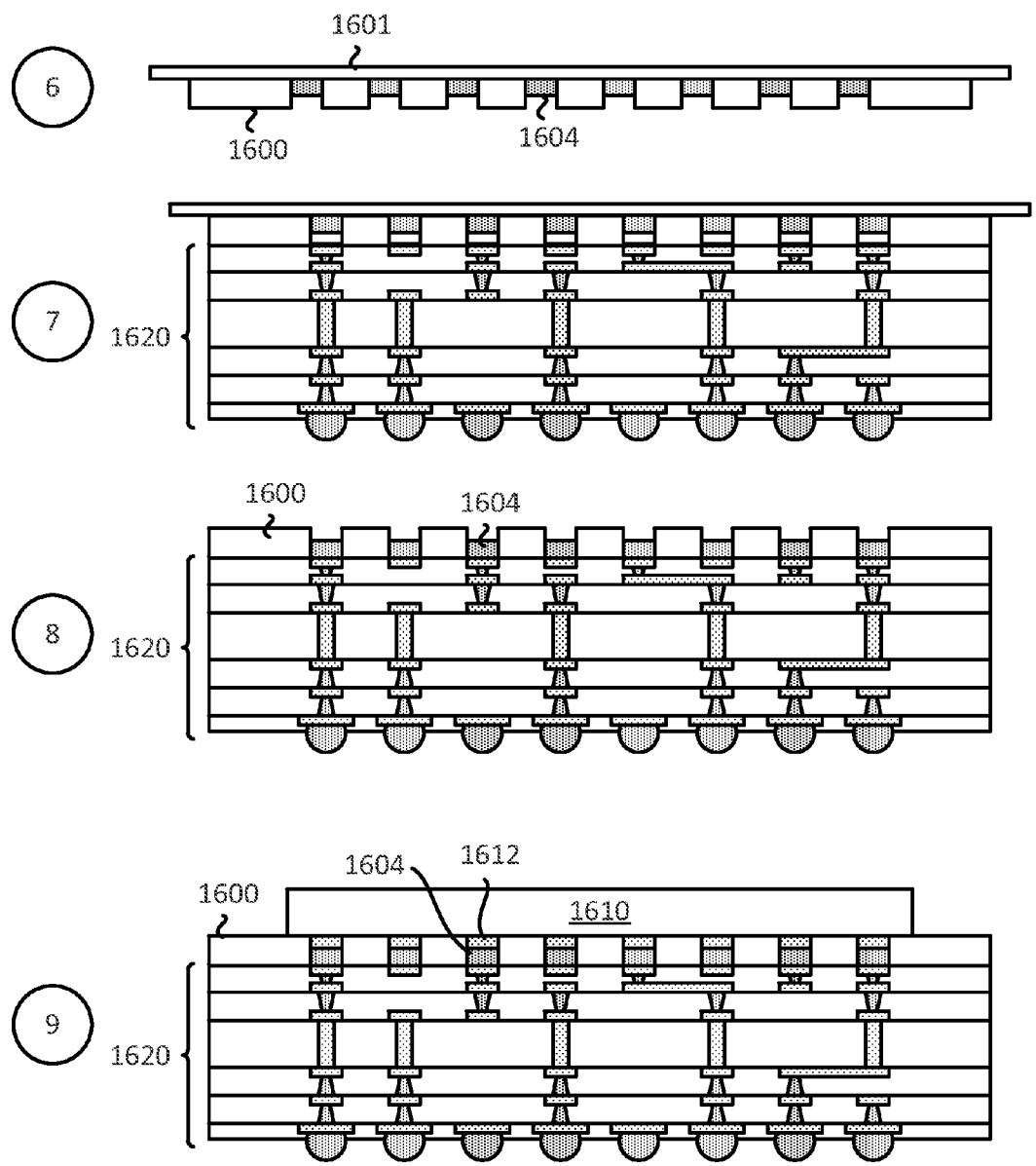

Exemplary Sequence for Providing/Fabricating an Integrated Device Package Comprising a Photosensitive Fill In some implementations, providing/fabricating an integrated device package that includes a photosensitive fill includes several processes. FIG. 16 (which includes FIGS. 16A-16B) illustrates another exemplary sequence for providing/fabricating an integrated device package that includes a photosensitive fill. In some implementations, the sequence of FIGS. 16A-16B may be used to provide/fabricate the integrated device package of FIGS. 4-8 and/or other integrated device packages described in the present disclosure. However, for the purpose of simplification, FIGS. 16A-16B will be described in the context of providing/fabricating the integrated device package of FIG. 6.

It should be noted that the sequence of FIGS. 16A-16B may combine one or more stages in order to simplify and/or clarify the sequence for providing an integrated device. In some implementations, the order of the processes may be changed or modified.

Stage 1, as shown in FIG. 16A, illustrates a state after a non-conductive layer 1600 is provided and coupled to a carrier 1601. The non-conductive layer 1600 may be a photosensitive layer. A photosensitive layer may be a material that is photo-etchable. The non-conductive layer 1600 may be a non-conductive film.

Stage 2 illustrates a state after a photo resist mask layer 1602 is formed and coupled to the non-conductive layer 1600. The photo resist mask layer 1602 may include a pattern, as illustrated by the cavities in the photo resist mask layer 1602.

Stage 3 illustrates a state after cavities are formed in the non-conductive layer 1600. In some implementations, the cavities are formed after a photo-etching process, where the non-conductive layer 1600 is exposed to a light (e.g., UV light) through the photo resist mask layer 1602, and portions of the non-conductive layer 1600 are removed (e.g., washed away).

Stage 4 illustrates a state after the photo resist mask layer 1602 is uncoupled (e.g., removed, lift off) from the non-conductive layer 1600, leaving the remaining non-conductive layer 1600 and the carrier 1601.

Stage 5 illustrates a state after a conductive interconnect 1604 is formed in the cavities (e.g., cavity 1603) of the non-conductive layer 1600. Different implementations may use different materials for the conductive interconnect 1604. In some implementations, the conductive interconnect 1604 is a paste (e.g., copper paste) and/or solder (e.g., cured solder, enhanced solder comprising a polymeric material). In some implementations, the conductive interconnect 1604 is formed in the cavities using a screen printing process. In some implementations, the conductive interconnect 1604 may be cured.

It should be noted that different implementations may provide different levels or amounts of conductive materials to form the conductive interconnect 1604. In some implementations, the cavities of the non-conductive layer 1600 are completely filled with the conductive material to form the conductive interconnect 1604. In other implementations, the cavities of the non-conductive layer 1600 are partially filled with the conductive material to form the conductive interconnect 1604. The conductive material in the cavities may move and shift within the cavities of the non-conductive layer 1600.

Stage 6, as shown in FIG. 16B, illustrates a state after the non-conductive layer 1600, the conductive interconnect 1604, and the carrier 1601 are flipped upside down.

Stage 7 illustrates a state after the flipped non-conductive layer 1600, the conductive interconnect 1604, and the carrier 1601 are coupled to the substrate 1620. In some implementations, the substrate 1620 (e.g., package substrate, interposer) is similar to the substrate 501 as shown and described in FIGS. 5-6. As shown at stage 7, the conductive interconnect 1604 is coupled to an interconnect (e.g., substrate interconnect, surface interconnect, embedded interconnect) of the substrate, in a manner as described above in at least FIGS. 5-6.

Stage 8 illustrates a state after the carrier 1601 is uncoupled (e.g., removed, lift-off) from the non-conductive layer 1600 and the conductive interconnect 1604, leaving behind the non-conductive layer 1600, the conductive interconnect 1604 and the substrate 1620.

Stage 9 illustrates a state after a die 1610 and the pillars 1612 are coupled to the non-conductive layer 1600 and the conductive interconnect 1604. The non-conductive layer 1600 may be a photosensitive fill.

Figure 17:
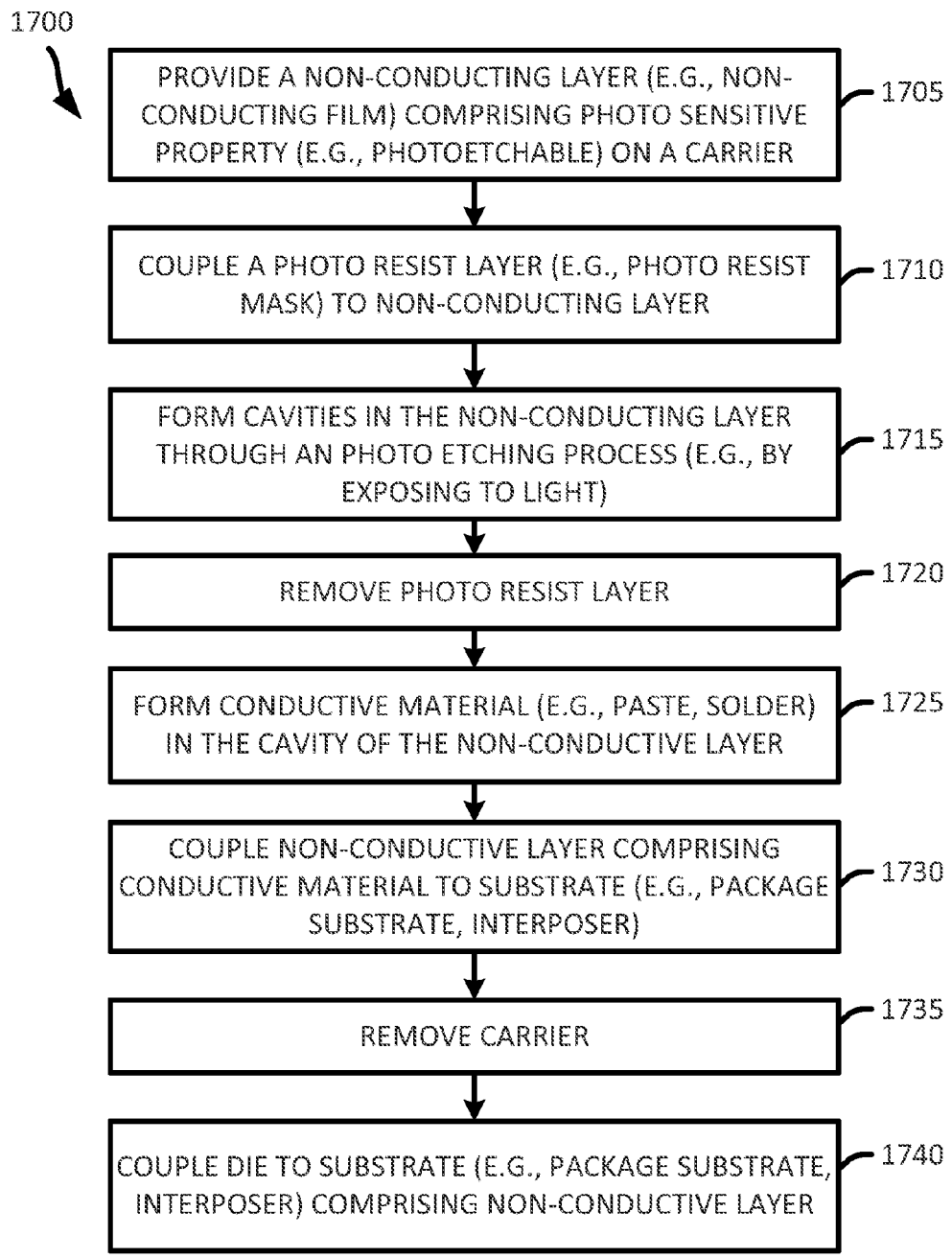
FIG. 17 illustrates an exemplary flow diagram of a method for providing/fabricating integrated device package that includes a photosensitive fill.

Exemplary Method for Providing/Fabricating an Integrated Device Package Comprising a Photosensitive Fill FIG. 17 illustrates an exemplary flow diagram of a method 1700 for providing/fabricating an integrated device package that includes a photosensitive fill. In some implementations, the method of FIG. 17 may be used to provide/fabricate the integrated device package that includes a photosensitive fill of FIGS. 4-8 and/or other capacitors in the present disclosure.

It should be noted that the flow diagram of FIG. 17 may combine one or more step and/or processes in order to simplify and/or clarify the method for providing an integrated device package. In some implementations, the order of the processes may be changed or modified.

The method provides (at 1705) provides a non-conductive layer and couples the non-conductive layer to a carrier. The non-conductive layer may be a photosensitive layer. A photosensitive layer may be a material that is photo-etchable. The non-conductive layer may be a non-conductive film.

The method couples (at 1710) a photo resist mask layer to the non-conductive layer. The photo resist mask layer may include a pattern.

The method also forms (at 1715) cavities in the non-conductive layer. In some implementations, the cavities are formed after a photo-etching process, where the non-conductive layer is exposed to a light (e.g., UV light) through the photo resist mask layer, and portions of the non-conductive layer are removed (e.g., washed away).

The method removes (at 1720) the photo resist mask layer, leaving the remaining non-conductive layer and the carrier.

The method then forms (at 1725) a conductive interconnect in the cavities of the non-conductive layer. Different implementations may use different materials for the conductive interconnect. In some implementations, the conductive interconnect is a paste (e.g., copper paste) and/or solder (e.g., cured solder, enhanced solder comprising a polymeric material). In some implementations, the conductive interconnect is formed in the cavities using a screen printing process. In some implementations, the conductive interconnect may be cured.

It should be noted that different implementations may provide different levels or amounts of conductive materials to form the conductive interconnect. In some implementations, the cavities of the non-conductive layer are completely filled with the conductive material to form the conductive interconnect. In other implementations, the cavities of the non-conductive layer are partially filled with the conductive material to form the conductive interconnect. The conductive material in the cavities may move and shift within the cavities of the non-conductive layer.

The method couples (at 1730) the non-conductive layer and the conductive interconnect to a substrate. The non-conductive layer may be a photosensitive fill. In some implementations, the substrate (e.g., package substrate, interposer) is similar to the substrate 501 as shown and described in FIGS. 5-6. The conductive interconnect is coupled to an interconnect (e.g., substrate interconnect, surface interconnect, embedded interconnect) of the substrate, in a manner as described above in at least FIGS. 5-6.

The method removes (at 1735) the carrier, leaving behind the non-conductive layer, the conductive interconnect, and the substrate.

The method couples (at 1740) a die comprising pillars to the non-conductive layer, the conductive interconnect, and the substrate. The pillars of the die are coupled to the conductive interconnect, which is coupled to interconnects of the substrate.

Exemplary Semi-Additive Patterning (SAP) Process

Various interconnects (e.g., traces, vias, pads) are described in the present disclosure. These interconnects may be formed in the package substrate and/or the redistribution portion of the integrated device package. In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

Different implementations may use different processes to form and/or fabricate the metal layers (e.g., interconnects, redistribution layer, under bump metallization layer, protrusion). In some implementations, these processes include a semi-additive patterning (SAP) process and/or a damascene process. These various different processes are further described below.

Figure 18:
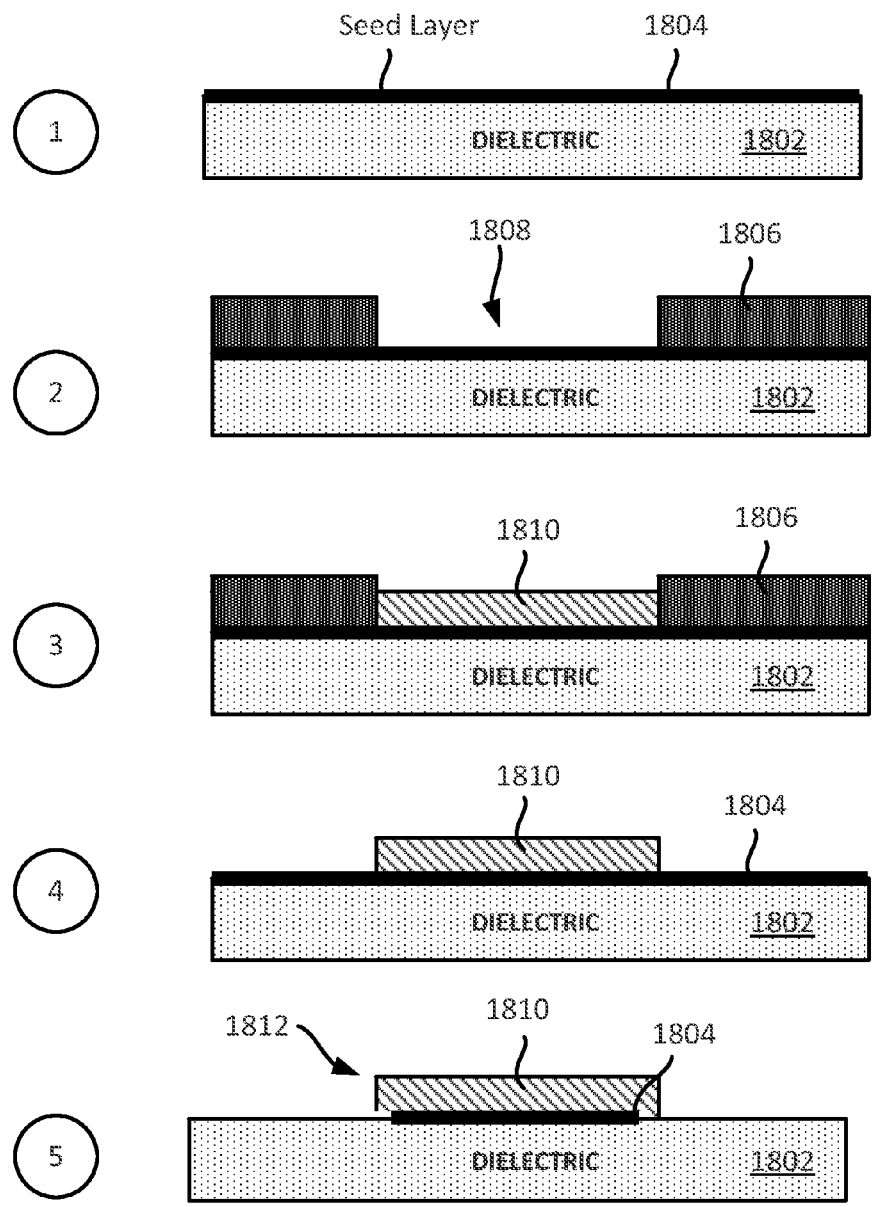
FIG. 18 illustrates an example of a semi-additive patterning (SAP) process.

FIG. 18 illustrates a sequence for forming an interconnect using a semi-additive patterning (SAP) process to provide and/or form an interconnect in one or more dielectric layer(s). As shown in FIG. 18, stage 1 illustrates a state of an integrated device (e.g., substrate) after a dielectric layer 1802 is provided (e.g., formed). In some implementations, stage 1 illustrates that the dielectric layer 1802 includes a first metal layer 1804. The first metal layer 1804 is a seed layer in some implementations. In some implementations, the first metal layer 1804 may be provided (e.g., formed) on the dielectric layer 1802 after the dielectric layer 1802 is provided (e.g., received or formed). Stage 1 illustrates that the first metal layer 1804 is provided (e.g., formed) on a first surface of the dielectric layer 1802. In some implementations, the first metal layer 1804 is provided by using a deposition process (e.g., PVD, CVD, plating process).

Stage 2 illustrates a state of the integrated device after a photo resist layer 1806 (e.g., photo develop resist layer) is selectively provided (e.g., formed) on the first metal layer 1804. In some implementations, selectively providing the resist layer 1806 includes providing a first resist layer 1806 on the first metal layer 1804 and selectively removing portions of the resist layer 1806 by developing (e.g., using a development process). Stage 2 illustrates that the resist layer 1806 is provided such that a cavity 1808 is formed.

Stage 3 illustrates a state of the integrated device after a second metal layer 1810 is formed in the cavity 1808. In some implementations, the second metal layer 1810 is formed over an exposed portion of the first metal layer 1804. In some implementations, the second metal layer 1810 is provided by using a deposition process (e.g., plating process).

Stage 4 illustrates a state of the integrated device after the resist layer 1806 is removed. Different implementations may use different processes for removing the resist layer 1806.

Stage 5 illustrates a state of the integrated device after portions of the first metal layer 1804 are selectively removed. In some implementations, one or more portions of the first metal layer 1804 that is not covered by the second metal layer 1810 is removed. As shown in stage 5, the remaining first metal layer 1804 and the second metal layer 1810 may form and/or define an interconnect 1812 (e.g., trace, vias, pads) in an integrated device and/or a substrate. In some implementations, the first metal layer 1804 is removed such that a dimension (e.g., length, width) of the first metal layer 1804 underneath the second metal layer 1810 is about the same or smaller than a dimension (e.g., length, width) of the second metal layer 1810, which can result in an undercut, as shown at stage 5 of FIG. 18. In some implementations, the above mentioned processes may be iterated several times to provide and/or form several interconnects in one or more dielectric layers of an integrated device and/or substrate.

Figure 19:
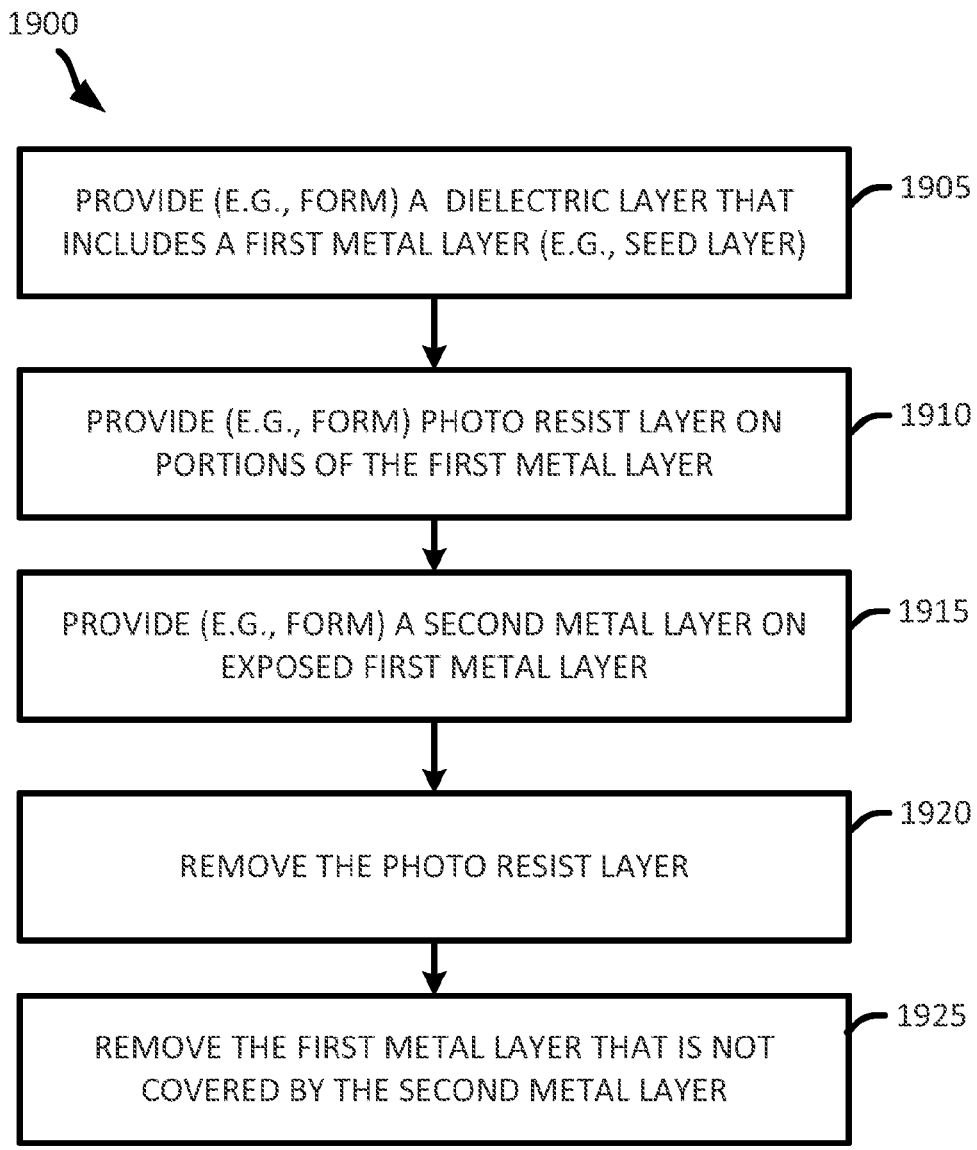
FIG. 19 illustrates an example of flow diagram of a semi-additive patterning (SAP) process.

FIG. 19 illustrates a flow diagram for a method for using a (SAP) process to provide and/or form an interconnect in one or more dielectric layer(s). The method provides (at 1905) a dielectric layer (e.g., dielectric layer 1802). In some implementations, providing the dielectric layer includes forming the dielectric layer. In some implementations, providing the dielectric layer includes forming a first metal layer (e.g., first metal layer 1804). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1910) a photo resist layer (e.g., a photo develop resist layer 1806) on the first metal layer. In some implementations, selectively providing the resist layer includes providing a first resist layer on the first metal layer and selectively removing portions of the resist layer (which provides one or more cavities).

The method then provides (at 1915) a second metal layer (e.g., second metal layer 1810) in the cavity of the photo resist layer. In some implementations, the second metal layer is formed over an exposed portion of the first metal layer. In some implementations, the second metal layer is provided by using a deposition process (e.g., plating process).

The method further removes (at 1920) the resist layer. Different implementations may use different processes for removing the resist layer. The method also selectively removes (at 1925) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 20:
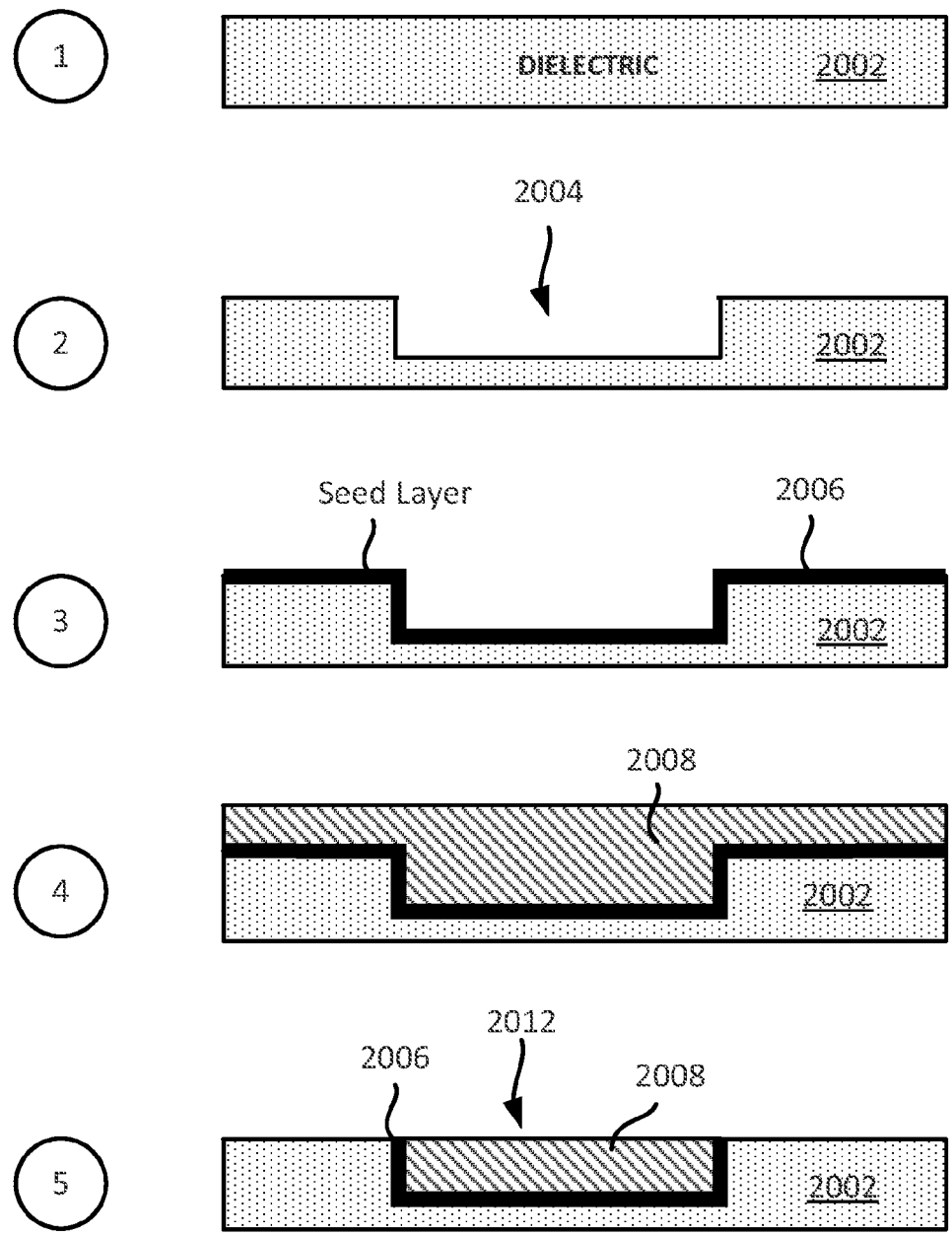
FIG. 20 illustrates an example of a damascene process.

FIG. 20 illustrates a sequence for forming an interconnect using a damascene process to provide and/or form an interconnect in a dielectric layer. As shown in FIG. 20, stage 1 illustrates a state of an integrated device after a dielectric layer 2002 is provided (e.g., formed). In some implementations, the dielectric layer 2002 is an inorganic layer (e.g., inorganic film).

Stage 2 illustrates a state of an integrated device after a cavity 2004 is formed in the dielectric layer 2002. Different implementations may use different processes for providing the cavity 2004 in the dielectric layer 2002.

Stage 3 illustrates a state of an integrated device after a first metal layer 2006 is provided on the dielectric layer 2002. As shown in stage 3, the first metal layer 2006 provided on a first surface of the dielectric layer 2002. The first metal layer 2006 is provided on the dielectric layer 2002 such that the first metal layer 2006 takes the contour of the dielectric layer 2002 including the contour of the cavity 2004. The first metal layer 2006 is a seed layer in some implementations. In some implementations, the first metal layer 2006 is provided by using a deposition process (e.g., physical vapor deposition (PVD), Chemical Vapor Deposition (CVD) or plating process).

Stage 4 illustrates a state of the integrated device after a second metal layer 2008 is formed in the cavity 2004 and a surface of the dielectric layer 2002. In some implementations, the second metal layer 2008 is formed over an exposed portion of the first metal layer 2006. In some implementations, the second metal layer 2008 is provided by using a deposition process (e.g., plating process).

Stage 5 illustrates a state of the integrated device after the portions of the second metal layer 2008 and portions of the first metal layer 2006 are removed. Different implementations may use different processes for removing the second metal layer 2008 and the first metal layer 2006. In some implementations, a chemical mechanical planarization (CMP) process is used to remove portions of the second metal layer 2008 and portions of the first metal layer 2006. As shown in stage 5, the remaining first metal layer 2006 and the second metal layer 2008 may form and/or define an interconnect 2012 (e.g., trace, vias, pads) in an integrated device and/or a substrate. As shown in stage 5, the interconnect 2012 is formed in such a way that the first metal layer 2006 is formed on the base portion and the side portion(s) of the second metal layer 2010. In some implementations, the cavity 2004 may include a combination of trenches and/or holes in two levels of dielectrics so that via and interconnects (e.g., metal traces) may be formed in a single deposition step. In some implementations, the above mentioned processes may be iterated several times to provide and/or form several interconnects in one or more dielectric layers of an integrated device and/or substrate.

Figure 21:
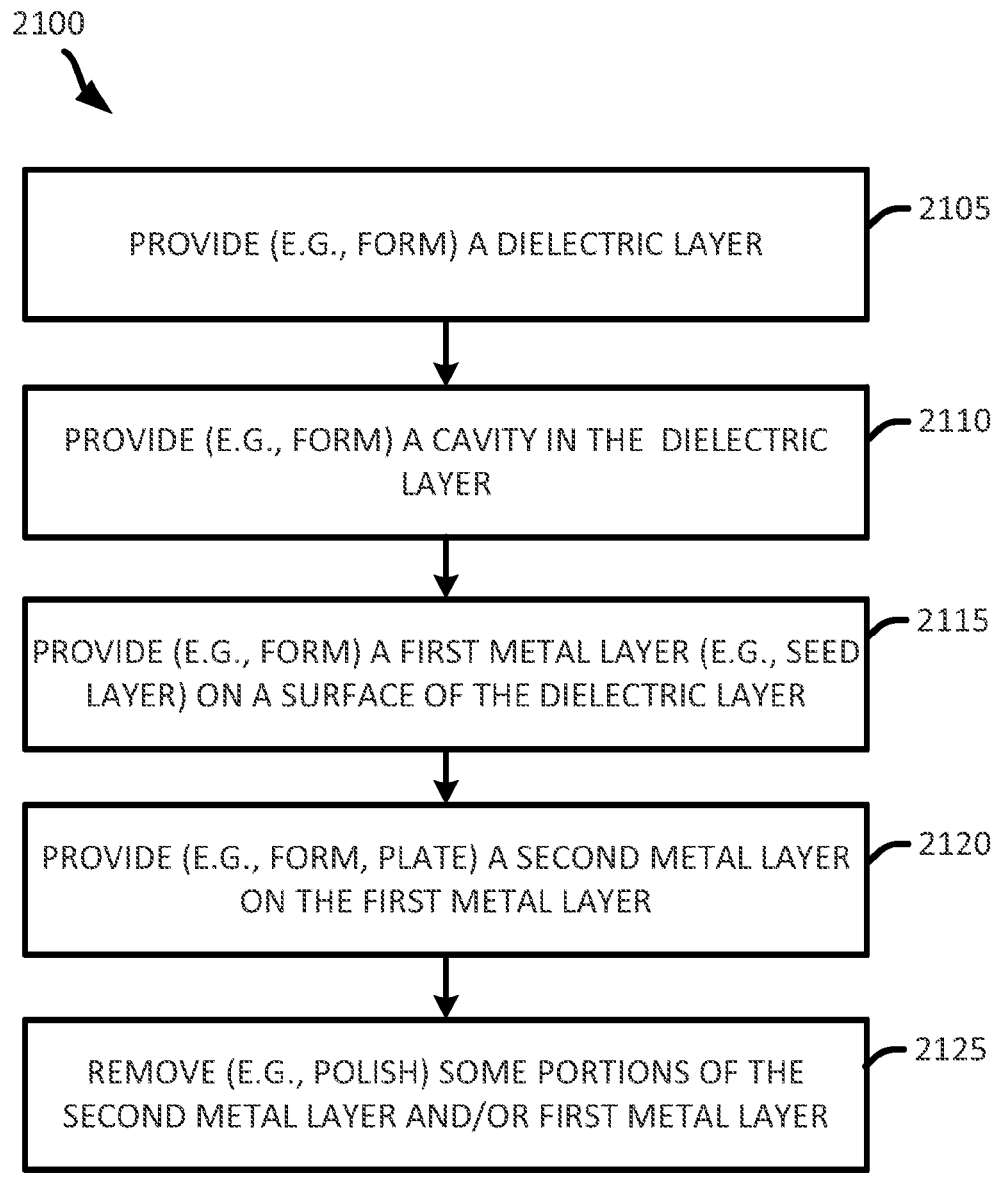
FIG. 21 illustrates an example of a flow diagram of a damascene process.

FIG. 21 illustrates a flow diagram of a method 2100 for forming an interconnect using a damascene process to provide and/or form an interconnect in a dielectric layer. The method provides (at 2105) a dielectric layer (e.g., dielectric layer 2002). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 2110) at least one cavity (e.g., cavity 2004) in the dielectric layer. Different implementations may use different processes for providing the cavity in the dielectric layer.

The method provides (at 2115) a first metal layer (e.g., first metal layer 2006) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 2006 is provided by using a deposition process (e.g., PVD, CVD or plating process).

The method provides (at 2120) a second metal layer (e.g., second metal layer 2008) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 2125) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 2012). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 22:
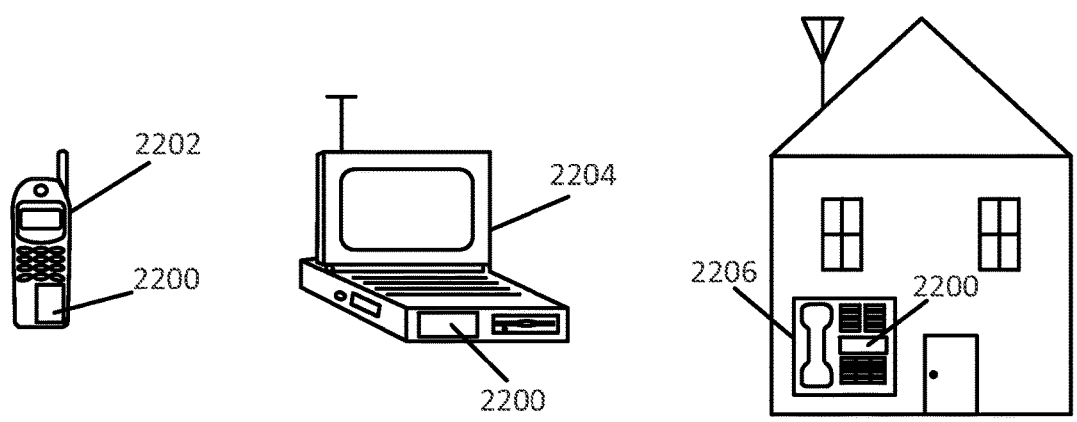
FIG. 22 illustrates various electronic devices that may integrate an integrated device, an integrated device package, a semiconductor device, a die, an integrated circuit, a substrate, an interposer and/or PCB described herein.

FIG. 22 illustrates various electronic devices that may be integrated with any of the aforementioned integrated device, semiconductor device, integrated circuit, die, interposer, package or package-on-package (PoP). For example, a mobile telephone 2202, a laptop computer 2204, and a fixed location terminal 2206 may include an integrated device 2200 as described herein. The integrated device 2200 may be, for example, any of the integrated circuits, dice, packages, package-on-packages described herein. The devices 2202, 2204, 2206 illustrated in FIG. 22 are merely exemplary. Other electronic devices may also feature the integrated device 2200 including, but not limited to, mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, wearable devices, tablet computers or any other device that stores or retrieves data or computer instructions, or any combination thereof.

One or more of the components, steps, features, and/or functions illustrated in FIGS. 4, 5, 6, 7, 8, 9A-9B, 10, 11A-11B, 12, 13, 14, 15, 16, 17, 18, 19, 20, 21 and/or 22 may be rearranged and/or combined into a single component, step, feature or function or embodied in several components, steps, or functions. Additional elements, components, steps, and/or functions may also be added without departing from the disclosure. It should also be noted that FIGS. 4, 5, 6, 7, 8, 9, 10, 11, 12, 13, 14A-14B, 15, 16A-16B, 17, 18, 19, 20, 21 and/or 22 and its corresponding description in the present disclosure is not limited to dies and/or ICs. In some implementations, FIGS. 4, 5, 6, 7, 8, 9, 10, 11, 12, 13, 14A-14B, 15, 16A-16B, 17, 18, 19, 20, 21 and/or 22 and its corresponding description may be used to manufacture, create, provide, and/or produce integrated devices. In some implementations, an integrated device may include a die, a die package, an integrated circuit (IC), an integrated device package, a wafer, a semiconductor device, a package on package, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

A 'set' of objects may include one or more objects. For example, a set of vias may include may include one or more vias. A set of interconnects may include one or more interconnects.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated package comprising:
   a die comprising a die interconnect, wherein the die interconnect comprises a die interconnect width;
   a substrate comprising a dielectric layer and a substrate interconnect, wherein the substrate interconnect comprises a substrate interconnect width;
   a single photosensitive fill layer located between the die and the substrate, the die interconnect embedded in the single photosensitive fill layer; and
   a conductive interconnect located within the single photosensitive fill layer, the conductive interconnect comprising a conductive interconnect width that is defined by the single photosensitive fill layer, the conductive interconnect width less than the substrate interconnect width, the conductive interconnect coupled to the die interconnect and the substrate interconnect, the conductive interconnect comprising a linear vertical side wall between the die interconnect and the substrate interconnect.

2. The integrated package of claim 1, wherein the single photosensitive fill layer is a non-conductive photosensitive material.

3. The integrated package of claim 1, wherein the single photosensitive fill layer is a photosensitive film.

4. The integrated package of claim 1, wherein the substrate interconnect width is equal to or greater than the die interconnect width.

5. The integrated package of claim 1, wherein the conductive interconnect includes one of at least a paste, a solder and/or an enhanced solder comprising a polymeric material.

6. The integrated package of claim 1, wherein the substrate interconnect is one of at least a surface interconnect and/or an embedded interconnect.

7. The integrated package of claim 1, wherein the die interconnect is one from a set of pillars comprising a pitch of about 40 microns (μm) or less.

8. The integrated package of claim 1, wherein the substrate is one of at least a package substrate and/or an interposer.

9. The integrated package of claim 1, wherein the integrated package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, and a laptop computer, and further including the device.

10. The integrated package of claim 1, wherein the conductive interconnect is formed within a cavity of the single photosensitive fill layer, and wherein the cavity defines the conductive interconnect width.

11. A method for fabricating an integrated package, comprising:
    providing a die comprising a die interconnect, the die interconnect comprising a pillar, wherein the die interconnect comprises a die interconnect width;
    coupling a single non-conductive photosensitive layer and a conductive interconnect to the die and the die interconnect, wherein the die interconnect and the conductive interconnect are located within the single non-conductive photosensitive layer, and wherein coupling the single non-conductive photosensitive layer and the conductive interconnect comprises coupling the conductive interconnect to the die interconnect, the conductive interconnect comprising a conductive interconnect width that is uniform across an entire height of the conductive interconnect and defined by the single non-conductive photosensitive layer, the conductive interconnect width less than a substrate interconnect width, the conductive interconnect comprising a linear vertical side wall; and
    coupling the die and the single non-conductive photosensitive layer to a substrate comprising a dielectric layer and a substrate interconnect, wherein the substrate interconnect comprises the substrate interconnect width and, wherein coupling the die and the single non-conductive photosensitive layer to the substrate comprises coupling the conductive interconnect to the substrate interconnect.

12. The method of claim 11, wherein the single non-conductive photosensitive layer is a photosensitive film.

13. The method of claim 11, wherein the substrate interconnect width is equal to or greater than the die interconnect width.

14. The method of claim 11, wherein the conductive interconnect includes one of at least a paste, a solder and/or an enhanced solder comprising a polymeric material.

15. The method of claim 11, wherein the substrate interconnect is one of at least a surface interconnect and/or an embedded interconnect.

16. The method of claim 11, wherein the die interconnect is one from a set of pillars comprising a pitch of about 40 microns (μm) or less.

17. The method of claim 11, wherein the substrate is one of at least a package substrate and/or an interposer.

18. The method of claim 11, wherein the integrated package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, and a laptop computer, and further including the device.

19. The method of claim 11, wherein the conductive interconnect is formed within a cavity of the single non-conductive photosensitive layer, and wherein the cavity defines the conductive interconnect width.

\* \* \* \* \*